United States Patent [19]

Dias et al.

[11] Patent Number: 5,010,331
[45] Date of Patent: Apr. 23, 1991

[54] TIME-KEY INTEGRATED CIRCUIT

[75] Inventors: Donald R. Dias, Carrollton; Robert D. Lee, Denton; Michael L. Bolan, Dallas; Francis A. Scherpenberg, Carrollton, all of Tex.

[73] Assignee: Dallas Semiconductor Corporation, Dallas, Tex.

[21] Appl. No.: 437,012

[22] Filed: Nov. 14, 1989

Related U.S. Application Data

[63] Continuation-in-part of Ser. No. 163,082, Mar. 2, 1988, Pat. No. 4,935,645, and a continuation-in-part of Ser. No. 163,279, Mar. 2, 1988, Pat. No. 4,897,860, and a continuation-in-part of Ser. No. 412,767, Sep. 26, 1989, Pat. No. 4,943,804, which is a continuation of Ser. No. 163,281, Mar. 2, 1988, Pat. No. 4,870,401, and a continuation of Ser. No. 163,280, Mar. 2, 1988, and a continuation of Ser. No. 273,698, Nov. 21, 1988.

[51] Int. Cl.⁵ .................. H04Q 1/00; H01H 47/00
[52] U.S. Cl. .................. 340/825.310; 340/325.340; 365/96
[58] Field of Search ........... 340/825.3, 825.31, 825.32, 340/825.34, 825.83, 825.84, 825.69, 825.72; 361/172; 70/277, 278; 307/10.1, 465; 365/96; 235/389, 382, 382.5

[56] References Cited

U.S. PATENT DOCUMENTS

| | | | |
|---|---|---|---|
| 4,594,637 | 6/1986 | Falk | 361/172 |
| 4,672,379 | 6/1987 | Lewiner et al. | 361/172 |
| 4,870,401 | 9/1989 | Lee et al. | 340/825.34 |

Primary Examiner—Donald J. Yusko
Assistant Examiner—Eric O. Pudpud

[57] ABSTRACT

A secure electronic circuit which (in its early life) can be electronically calibrated and written to, but thereafter holds its data securely.

1 Claim, 10 Drawing Sheets

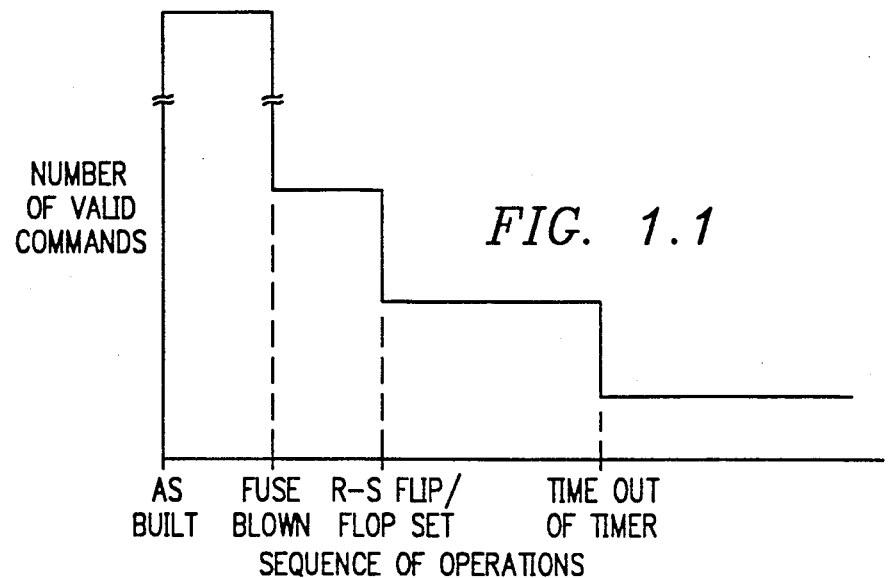
FIG. 1.1
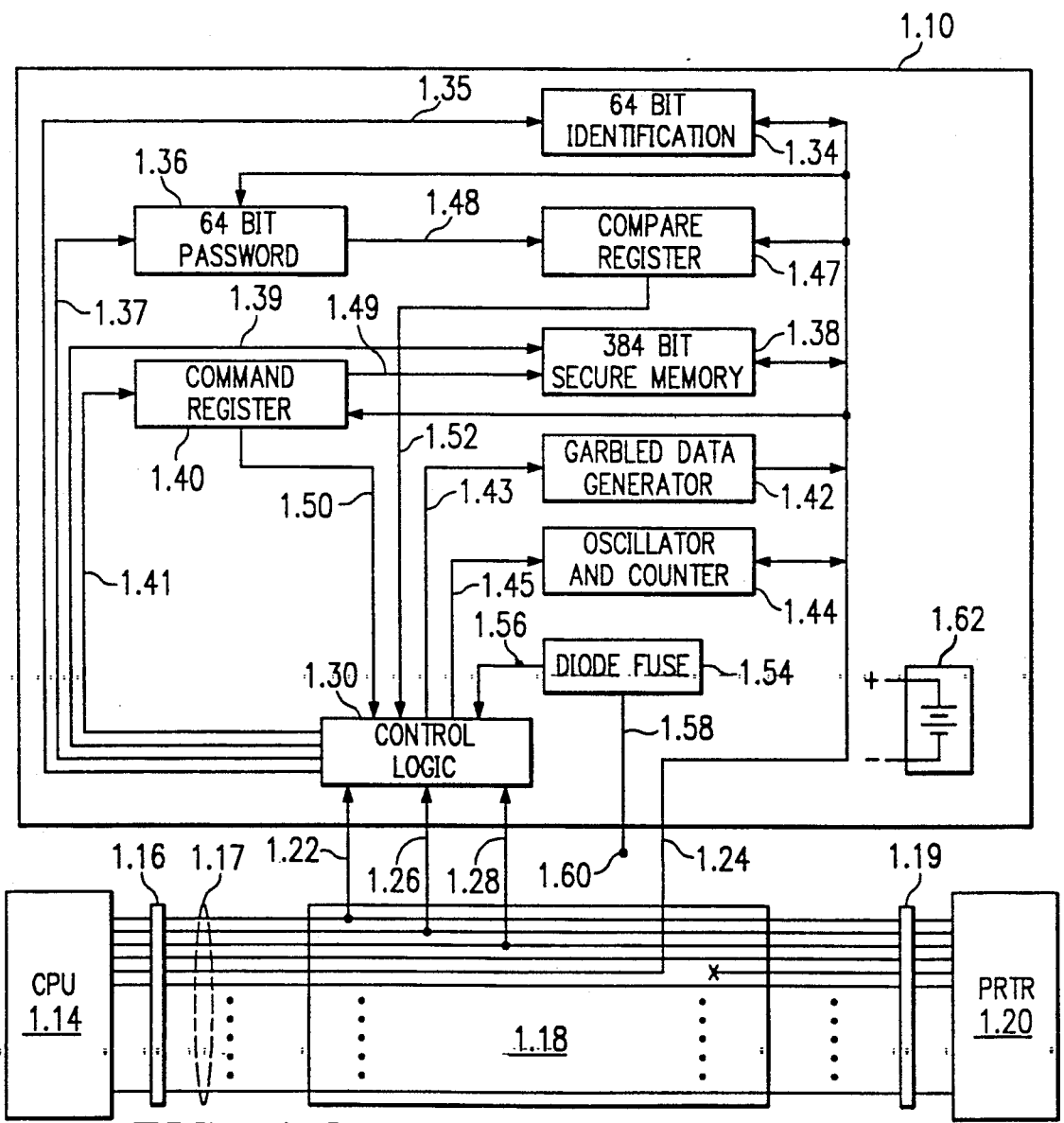
FIG. 1.2

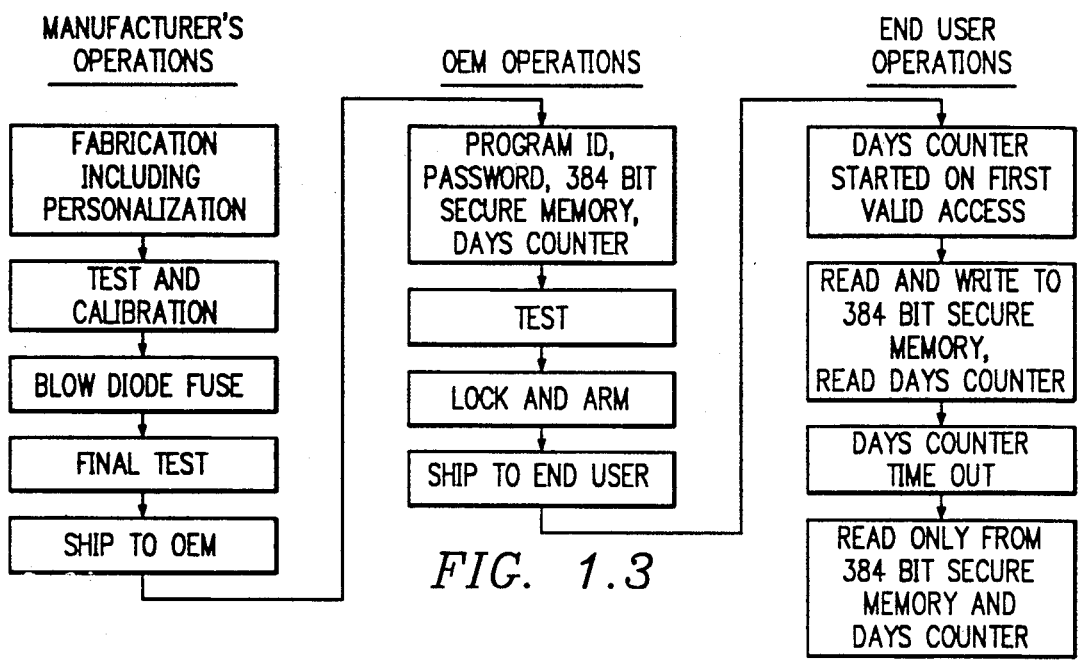
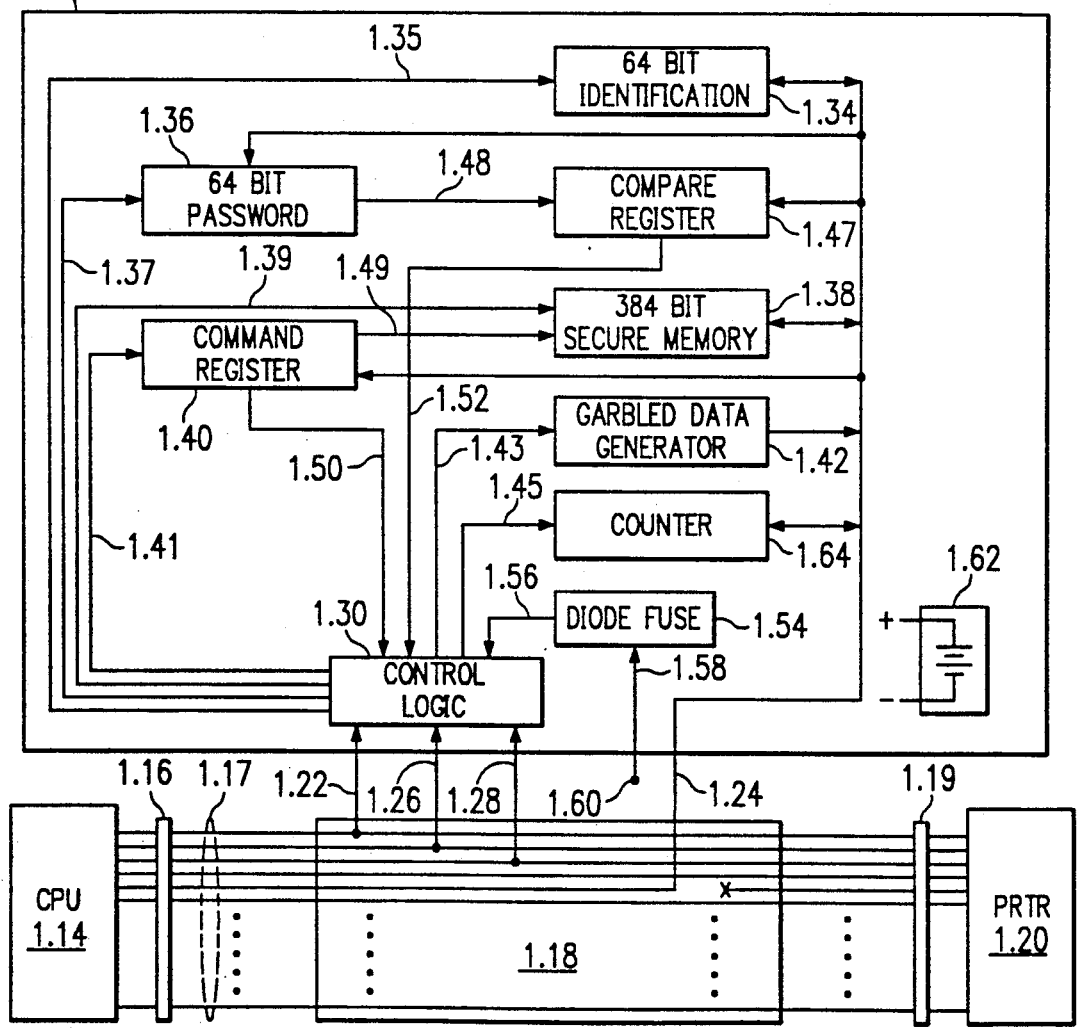

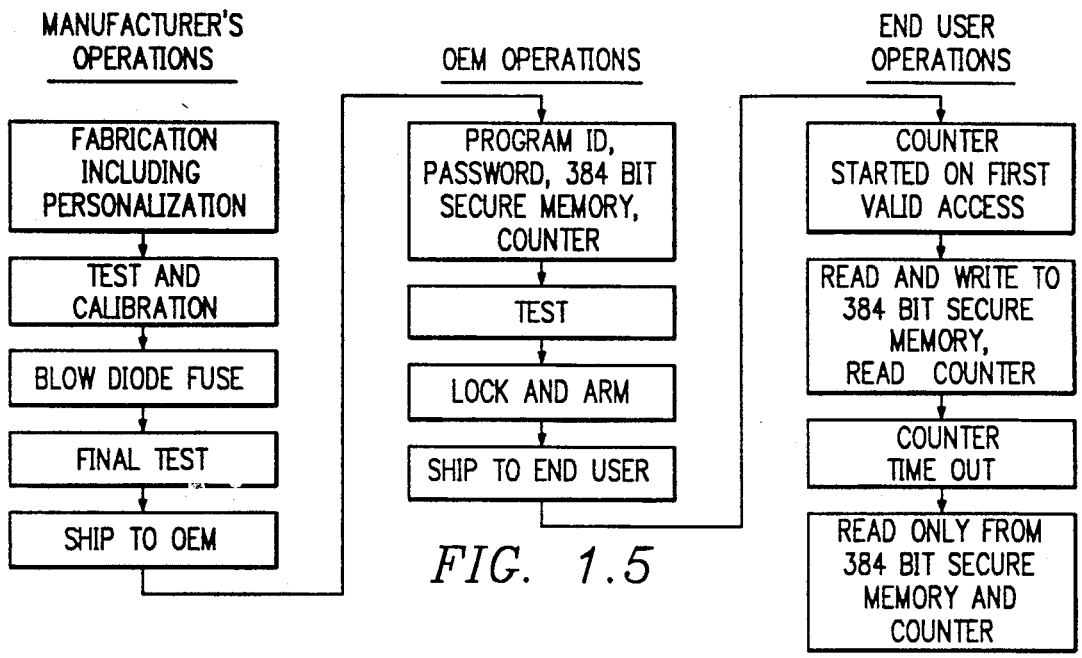
FIG. 1.5
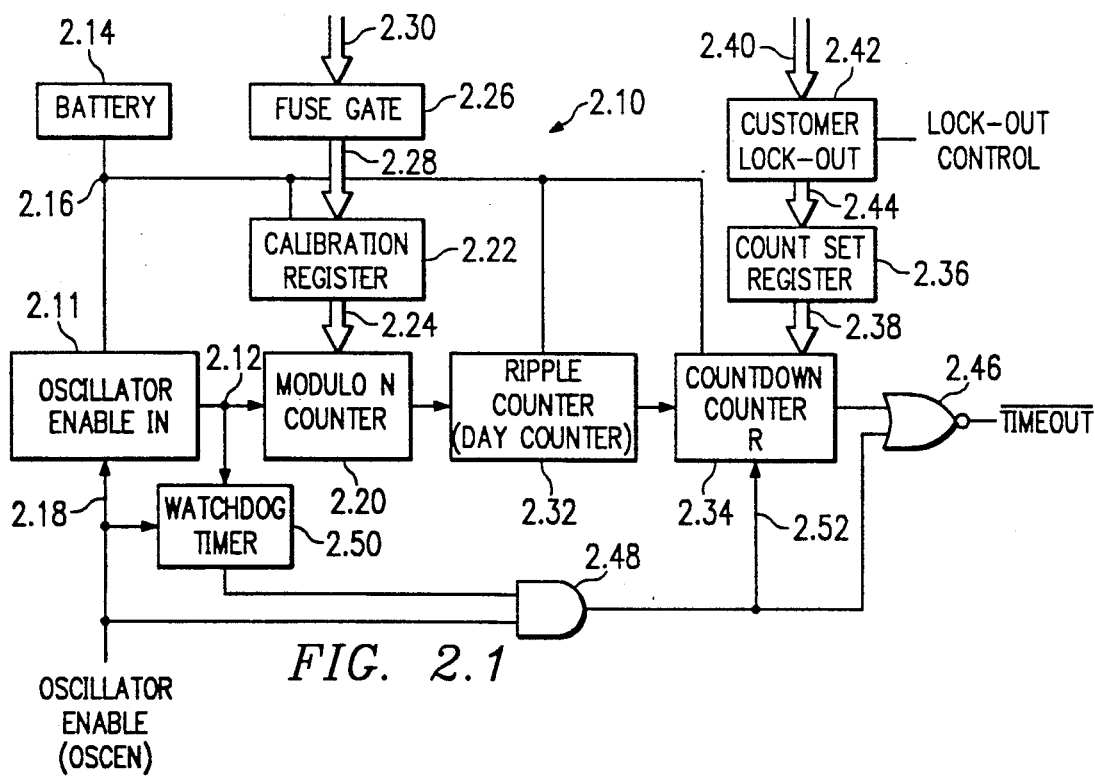
FIG. 2.1

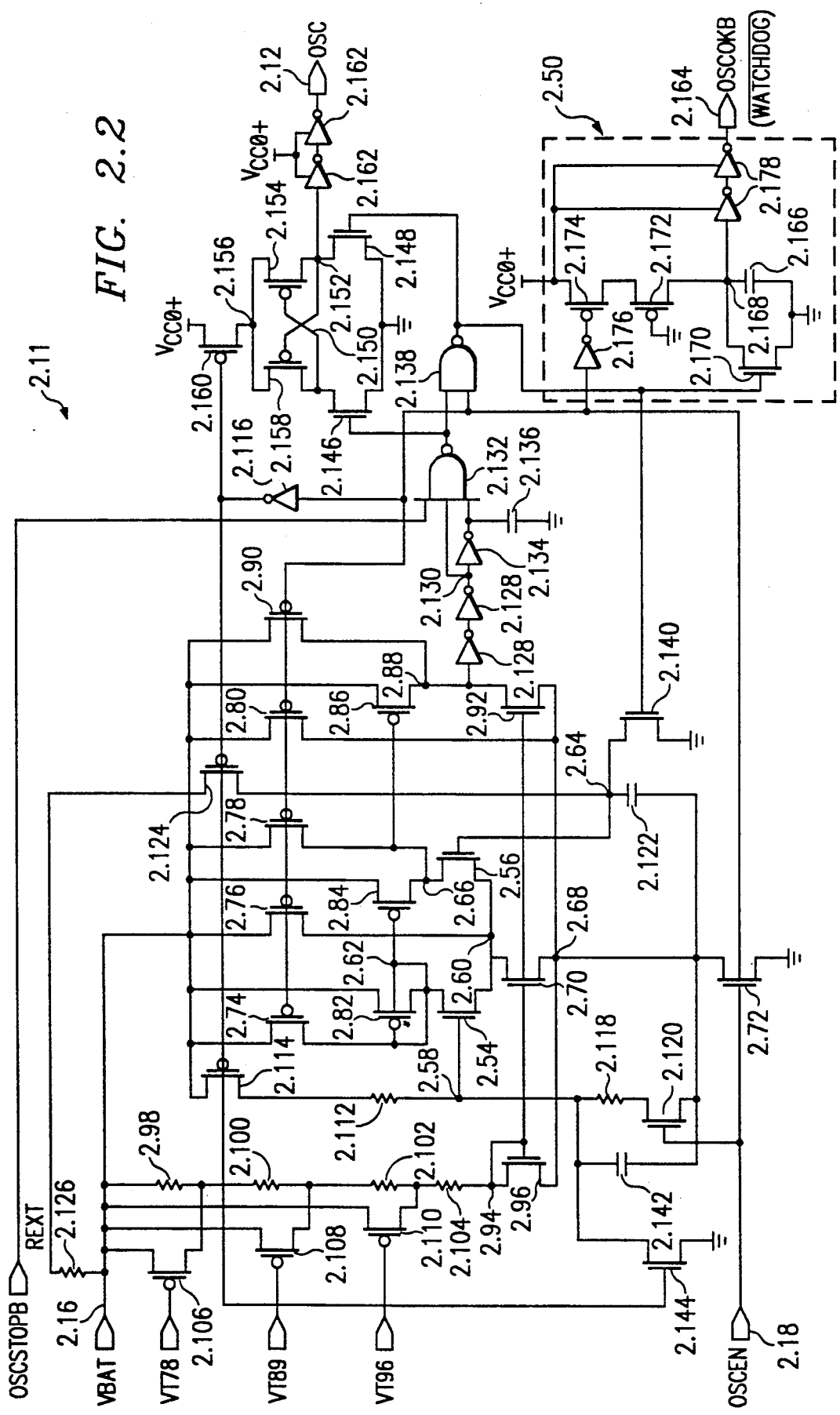
FIG. 2.2

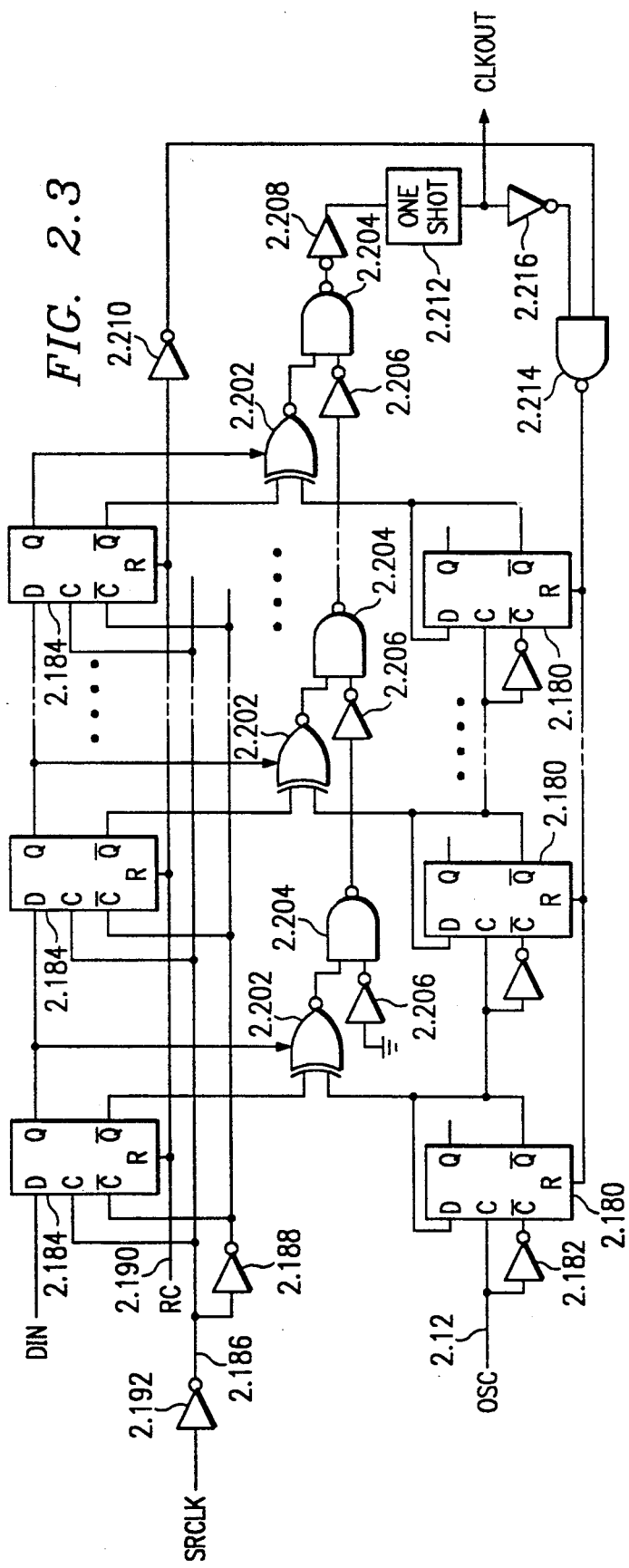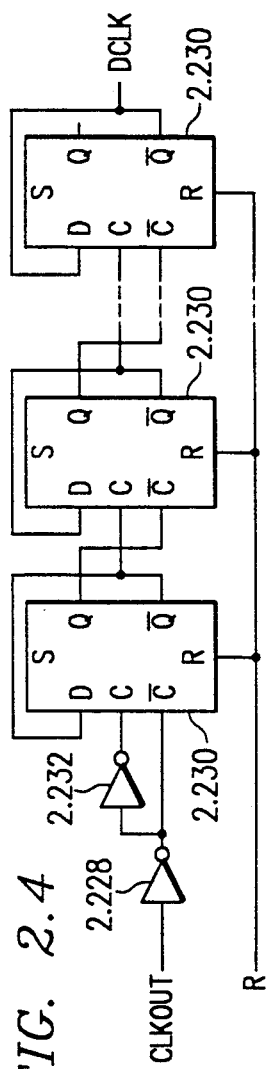
FIG. 2.3
FIG. 2.4

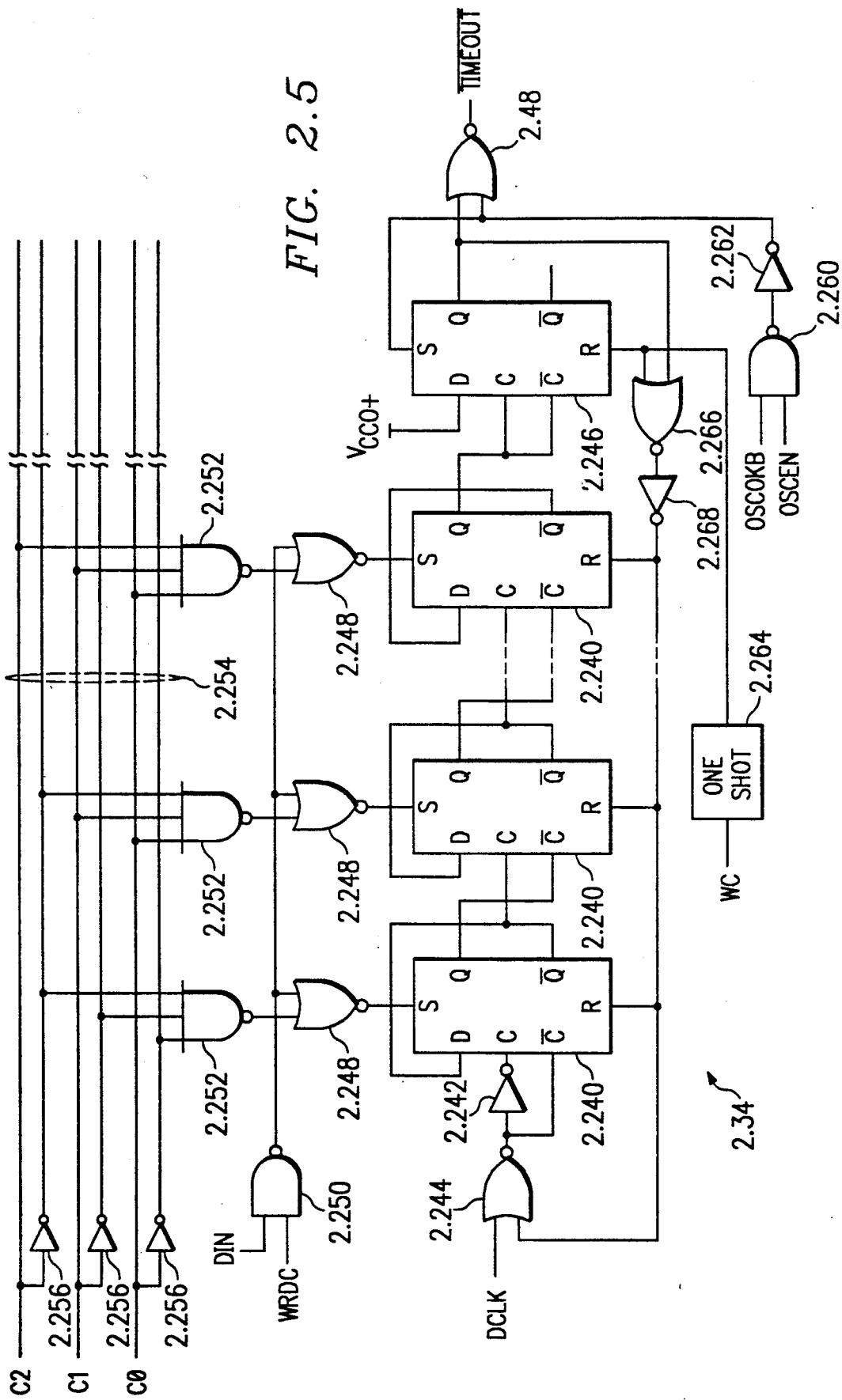
FIG. 2.5

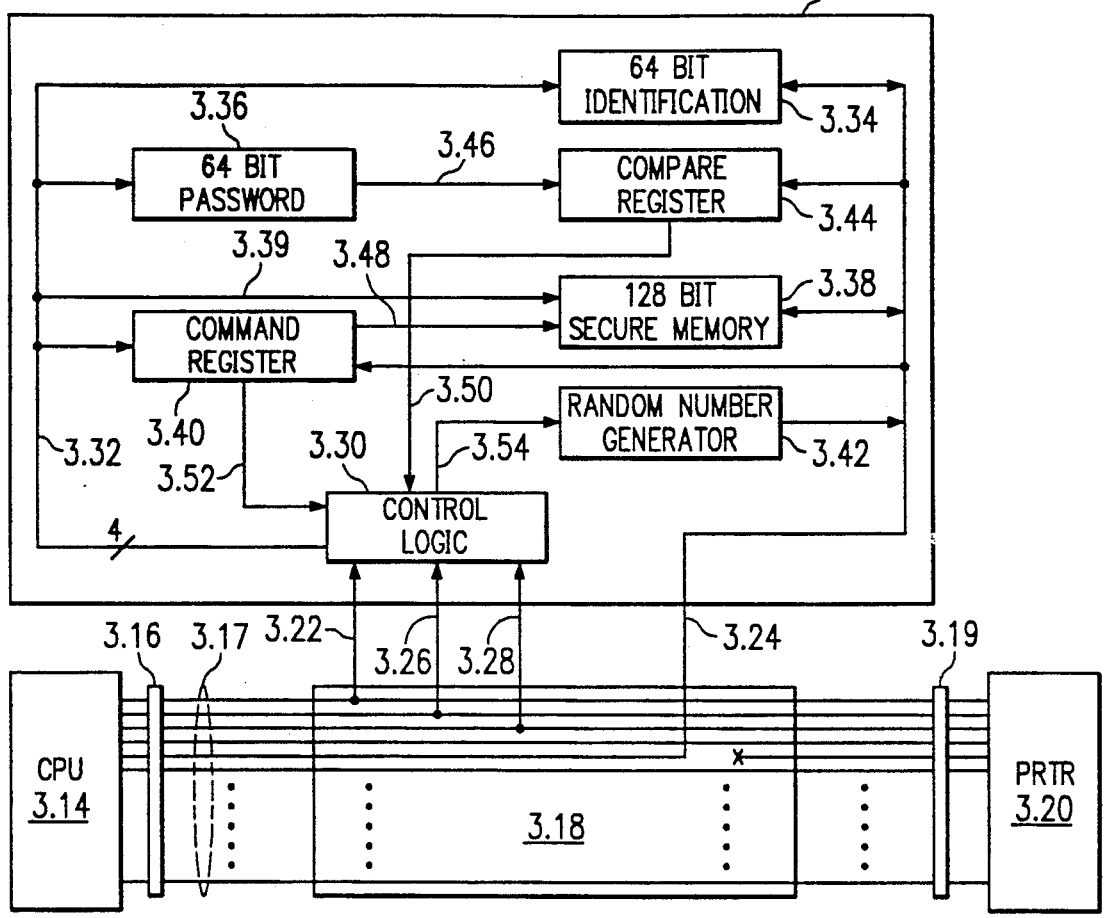
FIG. 3
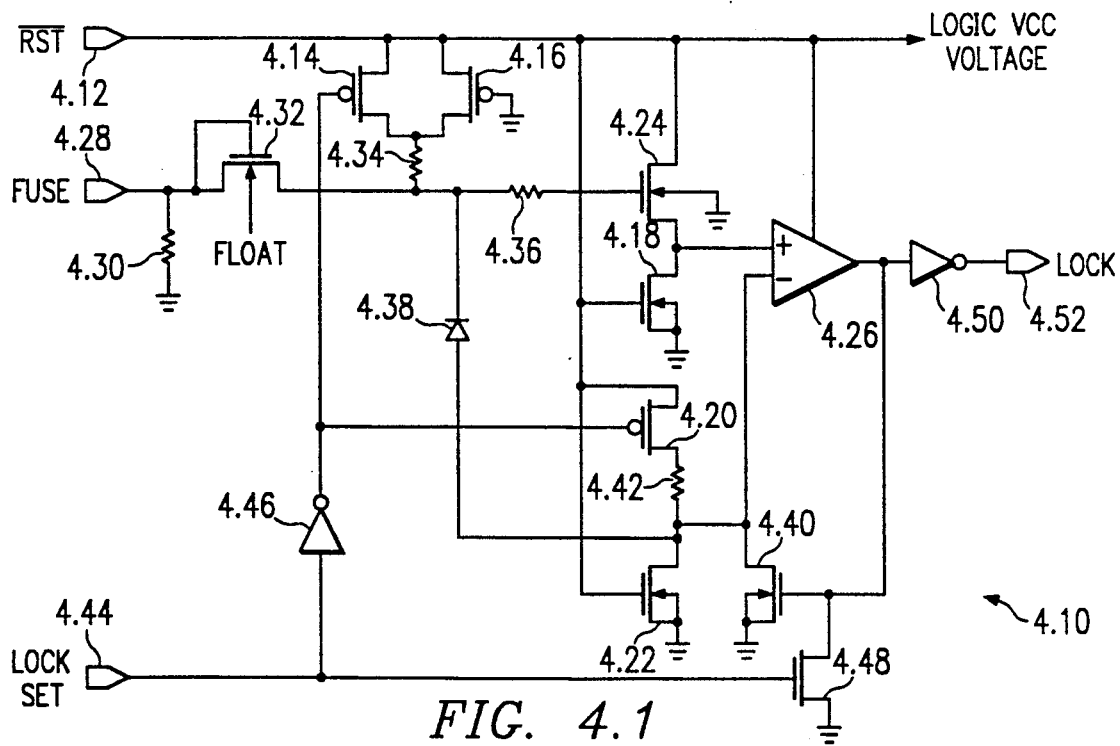
FIG. 4.1

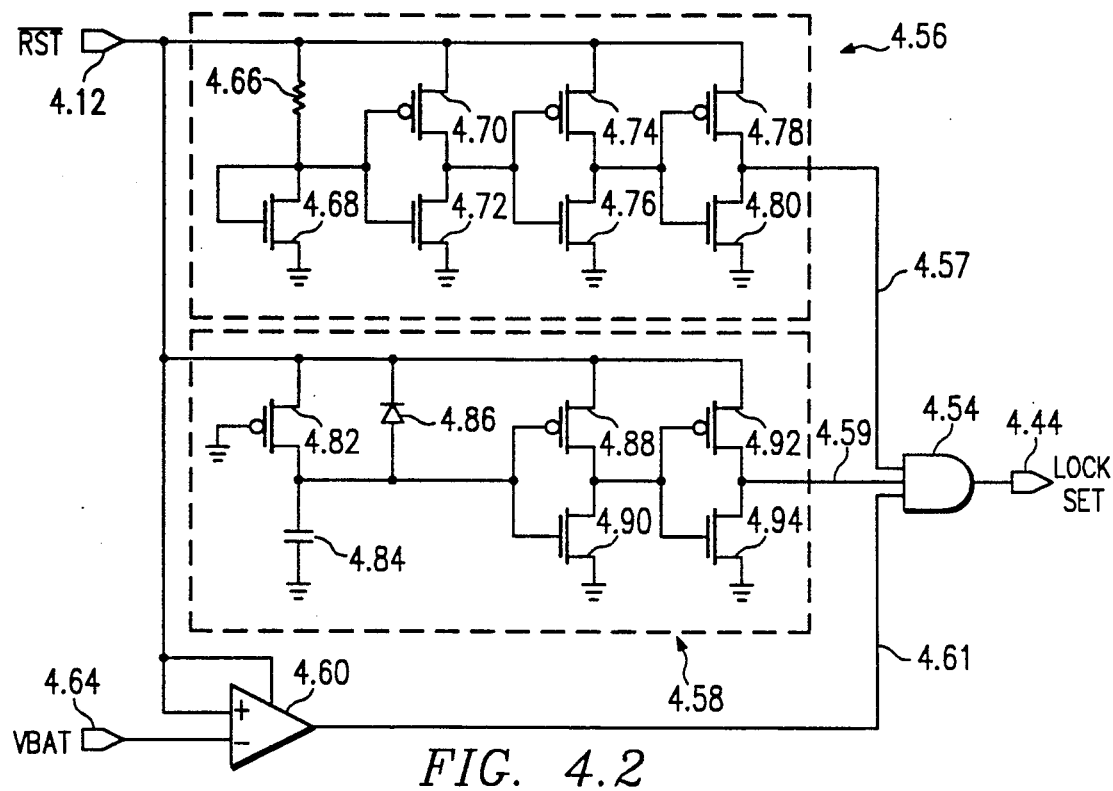
*FIG. 4.2*
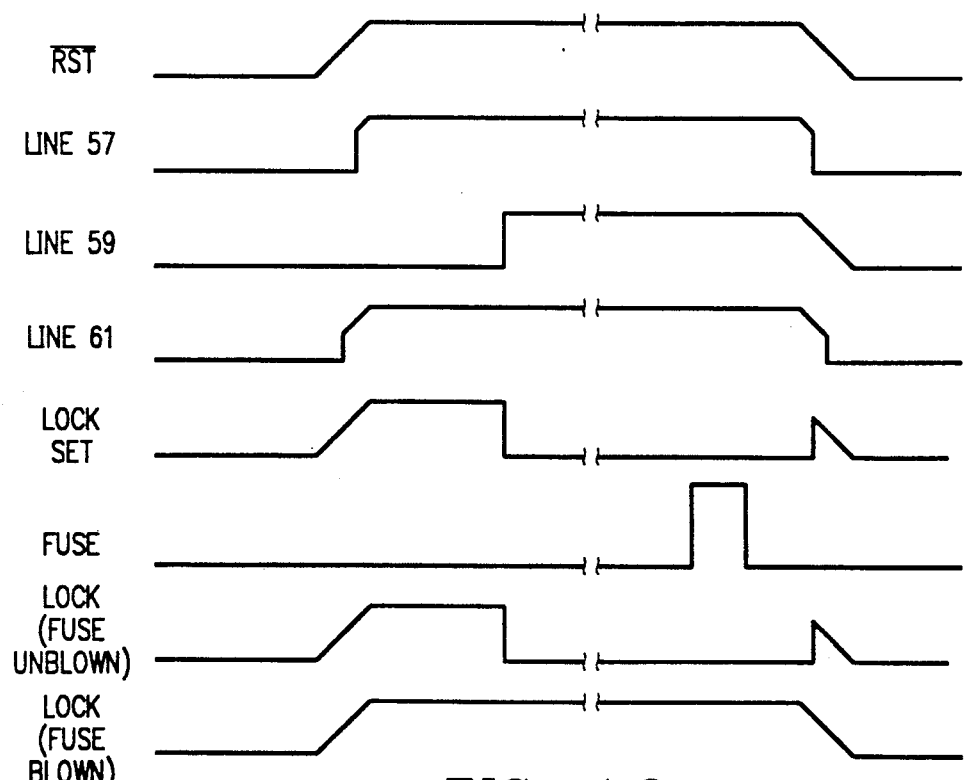
*FIG. 4.3*

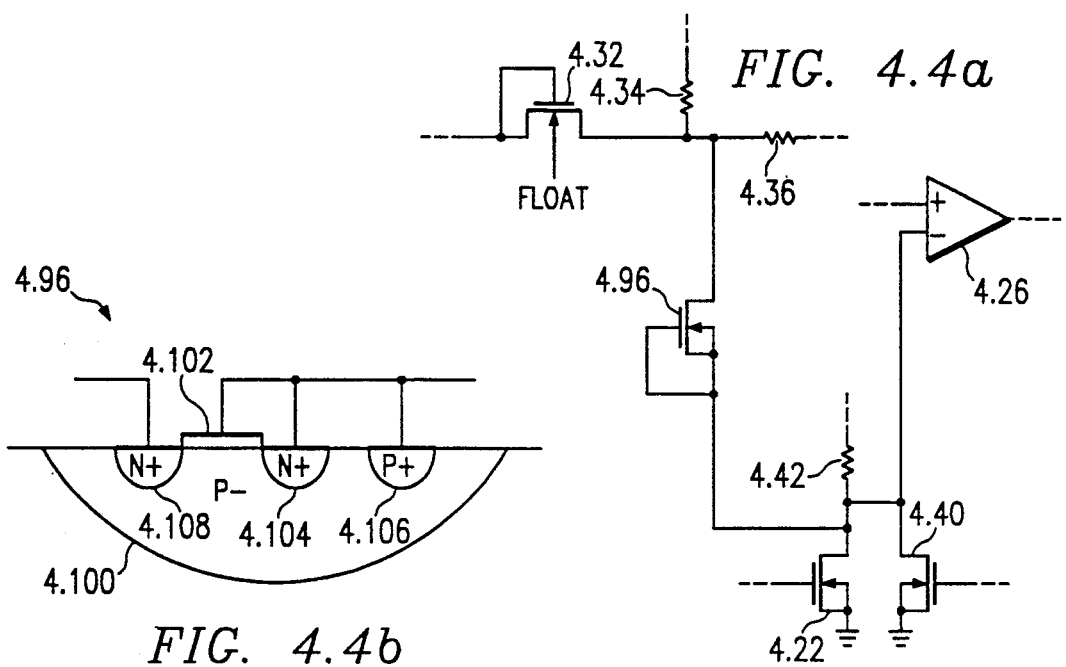
FIG. 4.4a
FIG. 4.4b
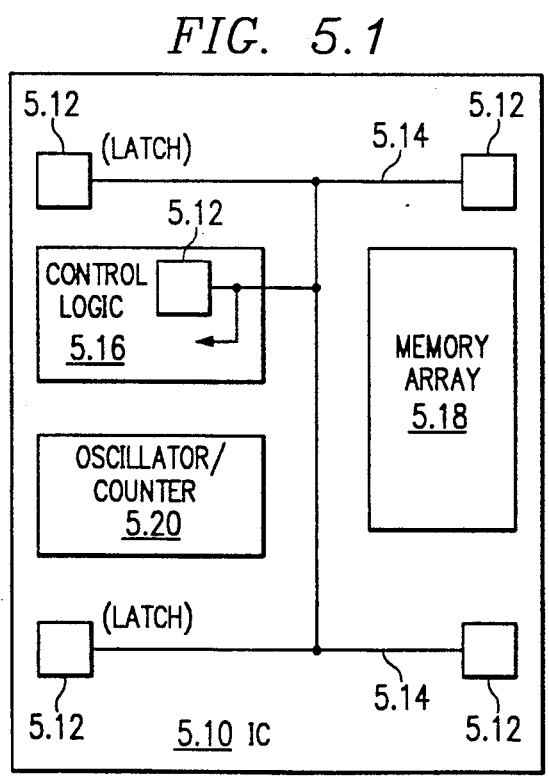
FIG. 5.1

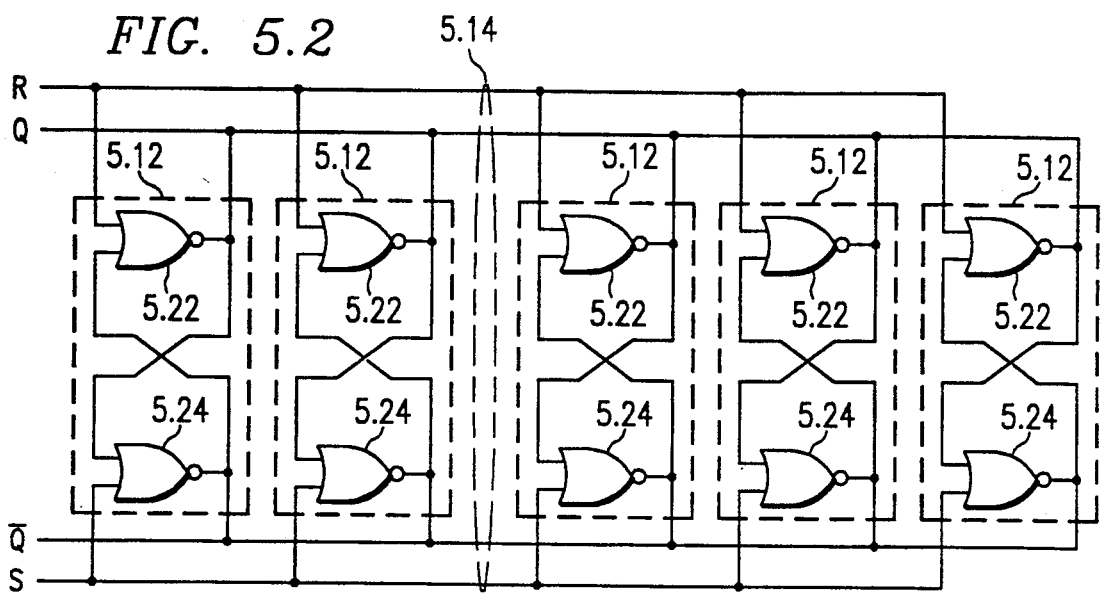
FIG. 5.2
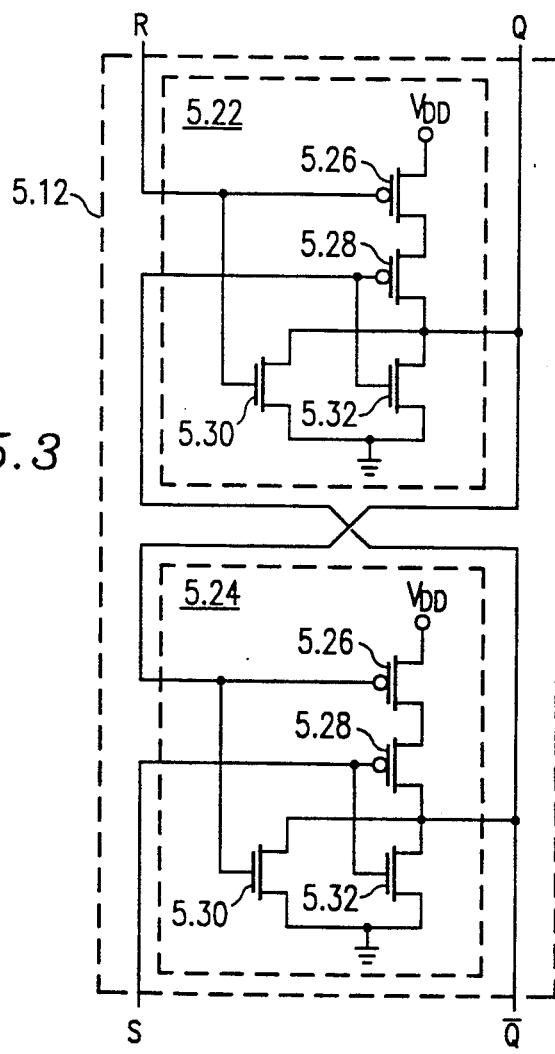
FIG. 5.3

5,010,331

TIME-KEY INTEGRATED CIRCUIT

CROSS-REFERENCE TO RELATED APPLICATIONS

The present application is a continuation-in-part of, and claims priority under 35 USC §120 from, the following applications of common assignee:

Ser. No. 163,082, Filed Mar. 2, 1988 (2846-16), entitled FUSING AND DETECTION CIRCUIT, now U.S. Pat. No. 4,935,645;

Ser. No. 163,279, Filed Mar. 2, 1988 (2846-17), entitled PROGRAMMABLE TIME BASE CIRCUIT WITH PROTECTED INTERNAL CALIBRATION; now U.S. Pat. No. 4,897,860;

Ser. No. 412,767, Filed Sept. 26, 1989 (2846-18A) now U.S. Pat. No. 4,943,804, entitled ELECTRONIC KEY LOCKING CIRCUITRY, which is a continuation of Ser. No. 163,281, Filed Mar. 2, 1988 and now issued as U.S. Pat. No. 4,870,401; and Ser. No. 163,280, Filed Mar. 2, 1988 (2846-198), entitled ESD RESISTANT LATCH CIRCUIT now Ser. No. 511,874; and Ser. No. 273,698, Filed Nov. 21, 1988 (2846-028), entitled ELECTRONIC KEY SECURITY METHOD AND APPARATUS.

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsmile reproduction by anyone of the patent document or patent disclosure, as it appears in the United States Patent and Trademark Office patent file or records, but otherwise reserves all copyright and maskwork rights whatsoever.

BACKGROUND AND SUMMARY OF THE INVENTION

The present invention relates to electronic keys, and to integrated circuits which provide electronic key functionality.

An electronic key is a circuit which performs the function of a key, using stored information instead of shaped metal. Such keys, and related circuits, have found use in a wide variety of applications.

However, electronic keys present some unusual difficulties in design. There is always some risk that an intruder may obtain a key and attempt to "crack" it, to gain free access to the system which is supposed to be protected. Thus, although perfect security may not be possible, the design must provide as much security as is economically possible.

The present application, and the parent applications, disclose a number of innovations which cooperate together to provide a greatly improved electronic key.

Limiting Key Lifetime

Electronic keys are used primarily to provide access to secure electronic data upon receipt of a valid password and to prohibit such access if an invalid password is received. One such application is the use of an electronic key hardware module in conjunction with commercially available software. The electronic key module is attached to the computer operating the software in a manner to allow the software to access the electronic key, and the software is programmed with an alogrithm to verify that the module is attached to the computer. Thus, while the software is easily copied, the electronic key hardware module is not; and the software cannot, therefore, be simultaneously used in several computers.

In a basic electronic key used with software, the software interrogates the key and verifies that the secure data matches data in the software. In more advanced forms of the electronic key, the electronic key allows data to be written into a random access memory inside the key and later read from the key, thus making an unauthorized duplication of the key or software to mimic the key more difficult.

It can be appreciated that other enhancements to electronic keys that add additional features to make the key more versatile and/or to enhance the security are advantageous and desirable for the customer of the electronic key manufacturer and, therefore, for the manufacturer itself.

Certain innovations disclosed herein provide an electronic key which has an additional function which limits the full operational life of the electronic key to a predetermined time interval or a predetermined number of cycles of operation.

Certain innovations disclosed herein provide an electronic key which has a fuse element to provide additional security in protecting at least some of the stored data.

Shown in an illustrated embodiment is an electronic key which recognizes as a valid command a command to perform at least one operation of a first plurality of operations if a timing circuit inside the electronic key has not detected that a predetermined time interval has lapsed. The electronic key recognizes as a valid command a command to perform at least one operation of a second plurality of operations if the timing circuit within the electronic key has detected that the predetermined time interval has lapsed.

Also shown in an illustrated embodiment is an electronic key which recognizes as a valid command a command to perform at least one operation of a first plurality of operations if a counting circuit inside the electronic key has not detected that the electronic key has undergone a predetermined number of particular operations. The electronic key recognizes as a valid command a command to perform at least one operation of a second plurality of operations if the counting circuit within the electronic key has detected that the electronic key has undergone a predetermined number of the particular operations.

Also shown in an illustrated embodiment is an electronic key containing a fuse element which, when unblown, permits signals appearing at an input terminal to be transferred to storage registers in the electronic key, and after being blown, isolates the input terminal from the storage registers.

Timeout Circuits

Time base circuits have been utilized for a number of years as the core of most electronic systems. These circuits can either be utilized to provide clock circuits or to provide a pulse at periodic intervals, among other applications. One type of circuit that utilizes the periodic interval type of time base is a "Timeout" circuit. Timeout circuits are typically preset to a predetermined time in an internal counter circuit, and an internal oscillator counts down from the preset time reference to zero time when an output pulse is provided. If the preset pulse is again received, the circuit then repeats this operation. At the heart of these circuits is a clock that determines the rate at which the counter operates.

One application for a Timeout circuit is a software protection key system. In this type of system, a supplier presets the Timeout circuit for a predetermined time. The Timeout circuit thus has a predetermined countdown duration and a Timeout pulse is produced after this duration. This Timeout pulse provides a signal to the software key that is utilized to invalidate the key and renders it useless. For example, a supplier or provider of the software key may wish to allow an individual access to a certain software system for a predetermined number of days. Once preset, the Timeout circuit allows the key to operate for this predetermined number of days, after which operation of the software key is inhibited.

One disadvantage to a Timeout circuit is the inherent accuracy of the circuits utilized to realize the Timeout circuit. Typically, some type of analog time base oscillator is utilized, which output is then divided down to give a relatively long time base. The dividing circuits are typically digital circuits which, of course, are very accurate. However, by comparison, the analog time base has inherent inaccuracies due to fabrication tolerances, power supply levels, etc., which directly affect the operation of the circuit. Typically, the fabrication tolerances in an analog oscillator are accounted for by trimming either the value of a resistor or the value of a capacitor that is associated with the timing components in the oscillator. Trimming has some inherent disadvantages in that conventional techniques are expensive to implement and require relatively sophisticated test procedures and/or circuit design techniques. Additionally, these trimming techniques are normally performed during test on an ideal power supply, which has a voltage level that may differ from that actually used in the Timeout circuit during operation in a specific application.

In view of the above disadvantages, there exists a need for a time base circuit which can be utilized as a Timeout circuit, and which does not require expensive trimming techniques and which provides a frequency that does not vary appreciably as a function of the power supply level.

An apparatus for generating a time base circuit with internal calibration according to innovative teachings disclosed herein includes an analog oscillator for generating an output signal having a predetermined operating frequency. The operating frequency is input to a programmable counter that divides the operating frequency by a factor of n. A storage register is provided for receiving and storing the value of n for interface to the programmable counter. A reference frequency is generated from the programmable counter and the value of n is inhibited from being altered after storage thereof.

In yet another embodiment of the present invention, a presettable countdown counter is provided for receiving the reference frequency and then counting the cycles thereof for a predetermined count value. The predetermined count value is stored in a discrete register and, after storage thereof, alteration of the contents of the discrete register is inhibited. At the end of the count, a Timeout signal is generated.

In yet another embodiment of the present invention, an internal battery is provided that powers the oscillator (and therefore the operating frequency of the oscillator may be dependent upon the battery voltage). The battery voltage also provides power for the storage of the value of n for the programmable counter and the count value of the countdown counter.

In a further embodiment of the present invention, a watchdog timer circuit is provided for detecting if the oscillator is stopped or the output frequency thereof altered outside a predetermined window. If the output of the oscillator is inhibited or altered, the Timeout signal is generated and the countdown counter is reset.

Security against Password Detection

Security systems which utilize electronic keys are used in many applications such as software protection security systems. In this example, and in general, electronic keys operate to protect secure data by determining if an access code or password received from an external device, such as a computer, is valid before permitting the secure data to be passed to the external device; i.e. the electronic key may then be used to enable the use of the protected entity.

However, a person trying to circumvent the security system could monitor the signal lines to an electronic key to discover the password or access code required by the key to cause the key to send secure data back to the external device. In prior art keys, the electronic key would provide the secure data back only when the proper access code was received but provide no response when an improper access code was received. Thus, it was fairly easy for a person to monitor the signal lines and detect the password required to access the secure data inside the electronic key.

Therefore, it can be appreciated that an electronic key system which provides enhanced security to the stored secure data stored in the electronic key is highly desirable.

Certain innovations disclosed herein provide a method and apparatus for enhancing the security of data stored in an electronic key.

Shown in an illustrated embodiment is a method and apparatus for enhancing the security of data stored in an electronic key in which the electronic key first receives a read request in conjunction with an access code from an external device. The electronic key then passes the data stored in the electronic key to the external device if the access code is determined to be a valid access code by the electronic key, and passes random data to the external device if the access code is determined to be an invalid access code by the electronic key.

Secure Fusing and Detection

In the parent application entitled "Electronic Key Locking Circuitry", there is described an electronic key which provides access to a random access memory upon receipt of a valid password. Included within one embodiment of this electronic key is a timing circuit which provides access to the RAM for a limited time only. This timing circuit is calibrated by the manufactured prior to shipment, and the calibration must be protected so that it cannot be altered by someone other than the manufacturer except in a manner specified by the manufacturer.

Since the integrated circuit is packaged with a backup battery and since the calibration is dependent on the characteristics of the battery, then it is convenient to assemble the integrated circuit and battery as one module and then to perform the calibration after the module has been assembled. However, if the calibration is to remain secure inside the integrated circuit, then a method must be used to lock out further calibration adjustments. In the application referenced above a fusing element is used which, when blown, prohibits further access to the calibration circuitry.

The circuit used in conjunction with the fuse element must thus be able to accommodate the currents and voltages required to "blow" the fuse, and further to detect whether the fuse has been blown. Furthermore, the fuse circuitry should be configured in such a manner that the security of the calibration cannot be breached by applying a specific voltage pattern to the pins of the integrated circuit in order to override the effect of the blown fuse.

Therefore, it can be appreciated that a diode and detection circuit which permits a fuse element to be blown, which detects the condition of the fuse element, and which is resistant to circumvention by an end user is highly desirable.

Certain innovations disclosed herein provide a fusing and detection circuit which enables a fusing element to be blown, which detects whether the fuse has been blown, and which is resistant to circumvention by an end user.

Shown in an illustrated embodiment is a circuit for presenting at an output terminal a voltage indicative of the impedance of a circuit element coupled between a first node and a second node. In the circuit a reference voltage is coupled to the first node and a third node voltage is formed by subtracting a predetermined voltage from the first node. The circuit also includes a current sink coupled to the second node and a comparator for comparing the voltages at the second and the third nodes and for providing a first voltage level at the output terminal if the second node voltage is greater than the third node voltage and provides a second voltage level at the output terminal if the second node voltage is less than the third node voltage.

In a further aspect of the invention, the circuit element is a fusible device and the first node is coupled to a fuse input terminal.

In another aspect of the invention, the output of the circuit is pulled to the first voltage level upon receipt of a lock set signal at a lock set input terminal.

Also shown in an illustrated embodiment is a method for detecting the condition of a fuse element which includes the steps of first applying a first reference voltage to one terminal of the fuse element connected to a first node and subtracting a predetermined voltage from the voltage at the first node to form a voltage at a second node. A relatively small amount of current is pulled from the second terminal of the fusing element and the voltage at the second terminal of the fuse element is compared with the voltage at the second node, and the result of this comparison is indicative of the condition of the fuse element.

ESD Resistance

In the parent application entitled "Electronic Key Locking Circuitry" there is described an electronic key which provides access to an internal random access memory upon receipt of a valid password. Included within one embodiment of this electronic key is an R-S flip-flop circuit which, when set, locks out certain commands that set the length of time of a time-out circuit within the electronic key. After the time-out circuit has timed out, the electronic key ceases to provide certain functions such as enabling data to be written into the random access memory. The end user, in order to avoid the time-out function, might try to reset the R-S flip-flop circuit by the application of an electrostatic discharge to one or more pins of the integrated circuit. There are also other conditions which can give rise to electrostatic discharge on the pins of an integrated circuit which would tend to disrupt data stored in a logic circuit.

It can, therefore, be appreciated that a R-S flip-flop circuit which is resistant to electrostatic discharge is highly desirable.

Certain innovations disclosed herein provide a latch circuit which is resistant to electrostatic discharge.

As shown in an illustrated embodiment, a latch circuit consists of a plurality of bistable multivibrator circuits. Each of the multivibrator circuits has an output terminal, and each of these output terminals are coupled together.

Also shown in an illustrated embodiment is a method to provide a storage circuit which is resistant to electrostatic discharge by first placing each of a plurality of the latch circuits at a location remote from each other on an integrated circuit chip. Second, an output terminal of each of the latch circuits is connected together.

BRIEF DESCRIPTION OF THE DRAWING

The present invention will be described with reference to the accompanying drawings, which show important sample embodiments of the invention and which are incorporated in the specification hereof by reference, wherein:

FIG. 1.1 is a plot of the relative number of valid commands recognized in the preferred embodiment of an electronic key according to innovative teachings disclosed herein for various conditions of the electronic key; FIG. 1.2 is a functional block diagram of a preferred embodiment of an electronic key according to innovative teachings disclosed herein; FIG. 1.3 is a flow chart of the manufacturing, OEM customization, and user operation of the preferred embodiment of an electronic key according to innovative teachings disclosed herein; FIG. 1.4 is a functional block diagram of an alternative embodiment of an electronic key according to innovative teachings disclosed herein; and FIG. 1.5 is a flow chart of the manufacturer, OEM customization, and end user operation of an alternative embodiment of an electronic key according to innovative teachings disclosed herein.

FIG. 2.1 illustrates a schematic diagram of a time base circuit utilized for a Timeout circuit; FIG. 2.2 illustrates a schematic diagram of an analog oscillator; FIG. 2.3 illustrates a logic diagram of a modulo N counter; FIG. 2.4 illustrates a logic diagram of a day counter; and FIG. 2.5 illustrates a logic diagram of a ripple counter that is presettable to provide a predetermined count.

FIG. 3 is a block diagram of an electronic key system in accordance with the present invention.

FIG. 4.1 is a circuit diagram of a fusing and detection circuit according to innovative teachings disclosed herein; FIG. 4.2 is a circuit diagram of circuitry used to form a lock set signal which is an input to the fusing and detection circuit shown in FIG. 4.1; FIG. 4.3 is a timing diagram showing various voltage waveforms applicable to the circuits shown in FIG. 4.1 and FIG. 4.2; and FIGS. 4.4a and 4.4b are a circuit diagram and a sectional view of an alternative embodiment of the fusing element shown in the circuit diagram of FIG. 4.1.

FIG. 5.1 is a layout diagram of an integrated circuit containing a latch circuit interconnected according to innovative teachings disclosed herein; FIG. 5.2 is a logic diagram of the latch circuits and the interconnections of the latch circuits shown in FIG. 5.1; and FIG. 5.3 is a schematic diagram of one of the latch circuits shown in FIG. 5.2.

DESCRIPTION OF THE PREFERRED EMBODIMENTS

The numerous innovative teachings of the present application will be described with particular reference to the presently preferred embodiment, wherein these innovative teachings are advantageously applied to the particular problems of a compact battery-powered electronic key. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Command Subsets

An electronic key according to a preferred embodiment of the present invention recognizes a first plurality or set of commands after initial fabrication as shown in FIG. 1.1. After the initial fabrication of the electronic key and after it has been attached to a battery and formed into a module, and after testing and calibration, a fuse is blown to reduce the number of valid commands recognized by the electronic key to a second plurality or second set of commands as shown in FIG. 1.1. Specifically, test and calibration commands are no longer recognized as valid commands by the electronic key after the fuse has been blown. When the electronic key is in this configuration, the key is next shipped to an original equipment manufacturer (OEM) who performs certain tests and programs certain data into the electronic key ring, including the number of days in which a timeout circuit will count down after it has been activated by an end user. The OEM then sends a lock oscillator command to the electronic key which sets an R-S flip-flop in the electronic key which further reduces the number of valid commands recognized by the electronic key to a third plurality or third set of commands. The OEM then issues an arm oscillator command which causes the electronic key to begin its internal timeout counter upon the first use of the electronic key by an end user.

The electronic key in this configuration is then shipped to an end user who can perform any of the third plurality of valid commands until the timeout counter completes its timeout cycle. Prior to the completion of the timeout cycle, the end user can read and write data from and to a secure memory inside the electronic key. When the timeout counter completes its timing cycle (when the time set by the OEM has expired) then the command set is further reduced to a fourth plurality or fourth set of commands which the electronic key ring will recognize. This fourth set of commands includes reading data from the secure memory but not writing data into the secure memory.

An example of the use of an electronic key according to innovative teachings disclosed herein would be for an OEM to ship the electronic key with its software which is provided to an end user on an evaluation basis. The software would be programmed to periodically write data to the electronic module and read data back and to cease its operation if the proper data is not read back from the electronic key. After the timeout cycle, the software would not be able to write data into the electronic key and therefore would detect an improper read when it tried to read data out of the electronic key. However, the ability to read data from the electronic key would permit the end user to send the electronic key back to the OEM who could read the data in the electronic key and provide the end user with another electronic key which had the proper data and would be compatible with the software held by the end user to allow the end user to continue to use the software with a new electronic key furnished by the OEM.

FIG. 1.2

A block diagram of an electronic key system containing an electronic key 1.10 in accordance with the present invention is shown in FIG. 1.2. Also shown is a central processing unit (CPU) 1.14 which has connected to it a parallel port connecter 1.16 through which passes a plurality of data lines and other signal lines 1.17. Connected to the parallel port connecter 1.16 is an interface circuit or key ring 1.18. Connected to the output of the key ring 1.18 is another parallel port connecter 1.19 which in turn is shown connected to a printer 1.20. Connected between the key ring 1.18 and the electronic key 1.10 are four lines: a clock line 1.22, a data line 1.24, a-reset-bar line 1.26, and a ground line 1.28.

Three of the four lines, the clock line 1.22, the reset-bar line 1.26 and the ground line 1.28, are connected to a control logic circuit 1.30 within the electronic key 1.10. The control logic circuit 1.30 has six outputs. The first output of the control logic circuit 1.30 is connected to the input of a 64 bit identification register 1.34 on a line 1.35; the second output is connected to the input of a 64 bit password register 1.36 on a line 1.37; the third output is connected to a first input of a 384 bit secure memory 1.38 on a line 1.39; the fourth output is connected to a first input of a command register 1.40 on a line 1.41; the fifth output is connected to the input of a garbled number generator 1.42 on a line 1.43; and the sixth output is connected to the input of an oscillator and counter circuit 1.44 on a line 1.45.

The data line 1.24 is connected to a bidirectional input/output terminal of the 64 bit identification register 1.34, to a second input of the 64 bit password register 1.36, to a first input of a compare register 1.47, to a bidirectional input/output terminal of the 384 bit secure memory 1.38, to a second input of the command register 1.40, to the output of a garbled data generator circuit 1.42, and to a bidirectional input/output terminal of the oscillator and counter circuit 1.44. The output of the 64 bit password register 1.36 appears on a line 1.48 which in turn is connected to a second input of the compare register 1.47. An output of the command register 1.40 appears on a line 1.49 which is connected to a second input of the 384 bit secure memory 1.38. Another output of the command register 1.40 appears on a line 1.50 which is connected to another input of the control logic circuit 1.30. The output of the compare register 1.44 appears on a line 1.52 which is connected to another input of the control logic circuit 1.30. The control logic 1.30 also has an input from a diode fuse circuit 1.54 on a line 1.56. The diode fuse circuit 1.54 has an input on a line 1.58 from a fuse input terminal 1.60 of the electronic key 1.10. The fuse input terminal 1.60 is not connected to the key ring 1.18, the fuse input terminal 1.60 being used only by the manufacturer of the electronic key 1.10 in the manner described in detail below.

It will be understood that the lines 1.35, 1.37, 1.39, 1.41, 1.45, 1.49, and 1.50 may carry multiple signals and may be multiple conductor lines rather than being single connections.

The circuitry described above as being included within the electronic key 1.10 is embodied in a CMOS integrated circuit in the preferred embodiments. The electronic key 1.10 also includes a back-up battery 1.62 which is connected to the CMOS integrated circuit and which provides back-up power for the CMOS integrated circuit, and power for the oscillator in the oscillator and counter circuit 1.44. In the preferred embodiments the CMOS integrated circuit and back-up battery are contained within a molded plastic package to form a portable module having connector pins for making the connections with the key ring 1.18 that are described above.

In the preferred embodiment, the data lines and other signals contained within the parallel port connector 1.16 out of the CPU 1.14 are passed directly to the printer 1.20 with the exception of the SLCTIN signal in the parallel port connector 1.16 which is used to provide data to and from the electronic key 1.10 on line 1.24. Since the SLCTIN signal is generally not used by peripheral printers, the key ring 1.18 directs this SLCTIN signal directly to line 1.24 leading into the electronic key 1.10 and disconnects the SLCTIN signal line from the peripheral device 1.20.

The other three lines, the clock line 1.22, the reset signal 1.26 and the ground line 1.28, are tapped off lines which are connected between the CPU 1.14 and the printer 1.20. The clock line 1.22 in the preferred embodiment is tapped off the line commonly known in the computer industry as the data out 1.3 (D3) line, and the reset-bar line 1.26 is tapped off the line commonly known as the data out 1.2 (D2) line. The ground line 1.28 is the standard ground line in the parallel port connector 1.16.

Although not shown in FIG. 1.2 nor discussed in detail for the sake of brevity, it will be understood that the electronic key ring 1.18 can be suitably modified by means known to those skilled in the art for use in virtually any communications path such as between the CPU 1.14 and a nonvolatile memory device, such as a ROM, inside of the CPU 1.14, or attached to an RS232 serial port. In at least some of these configurations, the electronic key ring 1.18 would contain additional switching and logic circuitry and would require an additional predetermined serial bit stream from the CPU 1.14 to signal the electronic key ring 1.18 to route certain signal lines to the electronic key 1.10 rather than through the normal communication channel.

With reference again to FIG. 1.2, each cycle of the electronic key 1.10 begins with a low-to-high transition on the reset-bar line 1.26 followed by a 24 bit command word. The reset-bar line 1.26 provides power to the electronic key 1.10 and must be held high during the entire transaction. Moreover, the voltage on the reset-bar line 1.26 must be brought low between each transaction in order to reset the electronic key 1.10. During a write operation of data into the electronic key 1.10, the data is transferred into the electronic key 1.10 on the rising edge of the clock signal appearing on the clock line 1.22; and during a read operation of data out of the electronic key 1.10, the data is presented on the data line 1.24 of the electronic key 1.10 on the falling edge of the clock signal on the clock line 1.22 and remain present while clock is low. The control logic 1.30 receives the clock signal on the clock line 1.22 and synchronizes the circuitry within the electronic key 1.10 with this clock signal.

When the electronic key 1.10 receives a command which it does not recognize as a valid command, a signal is sent by the command register 1.40 to the control logic 1.30 on line 1.50 which causes the control logic 1.30 to lock up and the electronic key 1.10 then ignores all other data until it receives another low-to-high transition on the reset-bar line 1.26.

After the electronic key 1.10 is initially fabricated, it will recognize a first plurality or set of valid commands which includes the nine commands described below together with testing commands used by the manufacturer to test the electronic key 1.10. This first set of valid commands also includes calibration commands for calibrating the oscillator and counter circuit 1.44 as described in parent application PROGRAMMABLE TIME BASE CIRCUIT WITH PROTECTED INTERNAL CALIBRATION.

After the electronic key 1.10 has been fabricated, tested, and calibrated, a fusing element in the diode fuse circuit 1.54 is blown, and this blown condition is transferred to the control logic 1.30 on line 1.56 which in turn is transferred to the command register 1.40 on line 1.41 which causes the command register 1.40 to ignore the testing and calibration commands which it recognized before the fuse was blown. Stated in another way, the testing and calibration commands which were recognized as valid commands before the fuse element in the diode fuse circuit 1.54 was blown are no longer recognized as valid commands. The diode fuse element in the diode fuse circuit 1.54 is blown by the application of the proper voltage at the fusing input terminal 1.60 of the electronic key 1.10. The diode fuse circuit 1.54 and its operation are described in detail in parent application FUSING AND DETECTION CIRCUIT.

After the fusing element in the diode fuse circuit 1.54 has been blown, the electronic key 1.10 is then shipped to an OEM. At this stage the electronic key 1.10 recognizes the following nine commands:

1. Read 20 bit counter command—upon receipt of this command, the electronic key 1.10 reads in sequence the logic state of the 20 bit counter in the oscillator and counter circuit 1.44 and places these logic states on the data line 1.24 upon the receipt of the next 20 clock cycles on the clock line 1.22.

2. Read 9 bit day counter command—upon receipt of this command, the electronic key 1.10 places the 9 bits in the 9 bit day counter located in the oscillator and counter circuit 1.44 onto the data line 1.24 upon receipt of the next nine clock cycles on the clock line 1.22.

3. Arm oscillator command—upon receipt of this command, the electronic key 1.10 sets a flag in the control logic 1.30. Upon receipt of the next valid command, the control logic 1.30 will set a signal on line 1.45 to the oscillator and counter circuit 1.44 to cause the oscillator to begin operating and to therefore begin the countdown of the countdown counter (consisting of the oscillator, 20 bit counter, and 9 bit counter).

4. Stop oscillator command—upon receipt of this command by the electronic key 1.10, the command register signals the control logic 1.30 which in turn signals the oscillator and counter circuit 1.44 to stop the oscillator and put the oscillator and counter circuit 1.44 as in a low power mode in order that the electronic key 1.10 may be stored for long periods of time without appreciably draining power from the backup battery used to provide backup power to the electronic key 1.10.

5. Write 9 bit day counter command—upon receipt of this command, the electronic key 1.10 will transfer the next sequential 9 bits of data appearing on the data line 1.24 into the 9 bit counter in the oscillator and counter circuit 1.44 in synchronization with the next 9 clock pulses received on the clock line 1.22.

6. Lock counter command—upon receipt of this command, an R-S flip-flop circuit within the control logic 1.30 is set by circuitry described in detail in parent application "ESD RESISTANT LATCH CIRCUIT." The status of this R-S flip-flop circuit is transferred on the line 1.41 to the command register 1.40 which, if the R-S flip-flop circuit has been set, causes the command register 1.40 to ignore any subsequent write 9 bit day counter and stop oscillator commands.

7. Write 64 bit identification/64 bit password command—upon receipt of this command, the electronic key 1.10 will transfer the next 64 bits of data on the data line 1.24 into the 64 bit identification register 1.34 and the following 64 bits on the data line 1.24 into the 64 bit password register 1.36 in synchronization with the clock signal appearing on the clock line 1.22.

8. Read 384 bit secure memory—upon receipt of this command, the electronic key 1.10 will first present the 64 bits in the 64 bit identification register 1.34 onto the data line 1.24 in synchronization with the clock signal on the clock line 1.22. The electronic key 1.10 then reads the next 64 bits presented on the data line 1.24 (the password) and compares the 64 bits with the data stored in the 64 bit password register 1.36 through the circuitry in the compare register 1.47. If the compare register 1.47 indicates that the proper 64 bit password has been received, then the control logic 1.30 causes the 384 bit secure memory 1.38 to place the 384 bits in the secure memory onto the data line 1.24 upon receipt of the next 384 clock signals on the clock line 1.22. If the 64 bit password sent to the electronic key 1.10 does not match the 64 bits stored in the 64 bit password register 1.36, the control logic 1.30 signals the garbled data generator 1.42 to place 384 bits of garbled data onto the data line 1.24. The garbled data generator 1.42 is described in U.S. Pat. No. 4,810,975, which is incorporated herein by reference.

9. Write 384 bit secure memory—upon receipt of this command, the electronic key 1.10 performs the same sequence of operations as in the read 384 bit secure memory command except that (a) upon receipt of the last 384 clock cycles, the data on the data line 1.24 is written into the 384 bit secure memory 1.38 and (b) upon receipt of an invalid password, the electronic key 1.10 will ignore all further clock signals until the signal on the reset-bar line 1.26 is brought low and then high again to reset the electronic key 1.10.

FIG. 1.3

Turning now to FIG. 1.3, a flow chart is shown of the relevant sequence of operations of the electronic key 1.10, specifically the manufacturing operation, the OEM customization, and the end user operations. When the electronic key 1.10 is being fabricated by the manufacturer, a personalization code of 13 bits, which is unique to each OEM customer of the manufacturer, is hardware programmed into the electronic key 1.10 as 1.13 of the 24 bits required in each valid command recognized by the electronic key 1.10. After the electronic key 1.10 is manufactured, the integrated circuit is attached to a backup battery and formed into an electronic key module.

At this time, the electronic key 1.10 is tested by the manufacturer, which tests include special tests commands recognized as valid commands by the electronic key 1.10. In addition, the electronic key 1.10 recognizes certain calibration commands used to calibrate the oscillator as described in the above-referenced co-pending patent application entitled ON CHIP TIME BASE. After the electronic key has been tested and calibrated, the fusing element within the diode fuse circuit 1.54 is blown in a manner described in the above-referenced co-pending application entitled FUSING AND DETECTION CIRCUIT.

After the fusing element in the diode fuse circuit 1.54 has been blown, the set of valid commands recognized by the electronic key 1.10 is reduced to the nine commands listed above. In addition, the blown state of the fusing element causes the electronic key to lock up if the primary power on the reset-bar line 1.26 and the power supplied by the backup battery 1.62 is interrupted. The lockup occurs because the 9 bit day counter in the oscillator and counter circuit 1.44 is biased to come up in the zero time state when power is applied to the counter, and the R-S flip-flop circuit is designed to come up in the set or locked state when power is applied. Thus, at this point in the sequence of operations, it is not possible to remove power from the electronic key 1.10 and reapply the power to reset the electronic key to a condition to recognize all of the valid commands available prior to the blowing of the fusing element or to a condition to recognize all of the valid commands available prior to the issuance of the lock command after the lock command has been sent to the electronic key 1.10.

After the fusing element is blown, the manufacturer performs a verification test and ships the electronic key 1.10 to the OEM whose personalization code has been hardware encoded into the electronic key 1.10 as described above.

The OEM then programs the identification bits in the 64 bit identification register 1.34, the password bits in the 64 bit password register 1.36, the 384 bit secure memory 1.38, and the 9 bit days counter in the oscillator and counter circuit 1.44. By using the arm oscillator command, the read 20 bit counter command, the read 9 bit day counter command, and the stop oscillator command, the OEM can verify that the countdown timer in the oscillator and counter circuit 1.44 is operating properly. After all of the above-mentioned bits have been properly programmed into the electronic key 1.10 and the oscillator has been stopped, the OEM issues a lock command. The effect of issuing this lock command is to set an R-S flip-flop circuit inside the control logic 1.30 which in turn operates to further reduce the command set which the electronic key 1.10 will recognize as valid commands. Specifically, after the R-S flip-flop circuit is set, the nine commands previously listed would now be recognized as valid commands with the exception of the write 9 bit day counter command and the stop oscillator command. The OEM would then issue an arm command so that the next valid command received by the electronic key 1.10 would start the oscillator and counter circuit 1.44.

When the OEM has completed his testing of the electronic key 1.10 and the electronic key 1.10 is ready for use by an end user, the oscillator and counter circuit 1.44 is in a low power mode configuration and thus the backup battery is able to provide backup power to the electronic key 1.10 for a relatively long period of time. Once the oscillator and counter circuit 1.44 have begun the timeout cycle, the power drawn by the oscillator and counter circuit 1.44 is appreciably greater than when the oscillator and counter circuit 1.44 is in a low power mode, and thus reduces somewhat the life of the backup battery. However, the power drain by the electronic key 1.10 when the timeout circuit is counting down is low enough to guarantee that the backup battery will provide adequate power for the electronic key 1.10 during the longest timeout cycle period.

After the end user has received the electronic key 1.10 and installed the electronic key 1.10 in his system, the first valid command recognized by the electronic key 1.10 will start the oscillator timeout period. Until the timeout circuit has completed the timeout cycle, the electronic key 1.10 will recognize the seven remaining valid commands.

After the timeout circuit has completed its cycle (i.e., has counted down to zero time remaining), the set of valid commands recognized by the electronic key 1.10 is further reduced to three valid commands in the preferred embodiment. These three valid commands are to read the 20 bit counter, to read the 9 bit day counter to verify that the counter has counted down to zero time, and to read the 384 bit secure memory. These last two commands allow the end user to verify that a timeout has occurred and allow the OEM to determine the appropriate data to program into another electronic key which, when sent to the end user, would allow the end user to resume using the software from the point when the timeout occured.

An alternative embodiment for an electronic key 1.10 according to innovative teachings disclosed herein is to replace the oscillator and counter circuit 1.44 with a down counter 1.64 which would be preprogrammed by the OEM in the same manner as the 9 bit day counter in the oscillator and counter circuit 1.44, and which would count down by one count for each valid command received by the electronic key 1.10 until the down counter 1.64 reaches the zero count state. The electronic key 1.10 would then operate in the same manner as when the oscillator and counter circuit 1.44 counted down to the zero time state. That is, when the down counter counted down to the zero count state, the electronic key 1.10 would recognize as valid commands only commands to read the state of the down counter 1.64 and to read the bits stored in the 384 bit secure memory 1.38.

In this alternative embodiment, there would not be calibration commands required nor commands to start the oscillator or stop the oscillator or a command to read the 20 bit counter. The only command required would be to write the down counter 1.64, which command would cease to be a valid command when the lock command is issued, and a command to read the state of the down counter 1.64. Alternatively, the down counter 1.64 could also be fabricated to count only certain of the valid commands received by the electronic key 1.10, for example, commands to read data from the 384 bit secure memory and to not count other valid commands received by the electronic key 1.10.

In a further alternative embodiment, a diode fuse circuit 1.54 could be replaced by an additional R-S flip-flop circuit. The reset state of this additional R-S flip-flop circuit would provide the same signal on line 1.56 as does the diode fuse circuit 1.54 prior to the time that the fusing element is blown, and the set status of the additional R-S flip-flop circuit would provide the same signal on line 1.56 as the diode fuse circuit 1.54 after the fusing element has been blown.

In this further alternative embodiment, the additional R-S flip-flop circuit can only be reset by the reapplication of battery voltage from the backup battery 1.62 after all power has been removed from the electronic key 1.10. This additional R-S flip-flop circuit powers up in the reset state due to capacitive biasing on the input terminals of the additional R-S flip-flop circuit.

At the place in the sequence of events listed above in which the fusing element in the diode fuse circuit 1.54 is blown, the additional R-S flip-flop circuit would be switched to the set condition in this further embodiment by the application of an appropriate command to the electronic key 1.10.

The advantage of this further alternative embodiment is that the fusing element is replaced by an additional R-S flip-flop circuit which is easier to fabricate and eliminates the problems associated with the blowing of the fusing element in the diode fuse circuit 1.54. The disadvantage is that the electronic key 1.10 then can be reset by an end user by the disconnection of the backup battery 1.62 and the reapplication of the backup battery 1.62. Of course, after the interruption of the battery backup voltage, all the data previously stored in the electronic key 1.10 would be lost and would have to be reprogrammed into the electronic key 1.10. While this loss in security might be unacceptable in some applications, this decreased security would be acceptable for certain other applications.

Thus, an electronic key has been described which has a range or set of valid commands which changes during the useful life of the electronic key from a first set or plurality of commands available when the electronic key is first fabricated to a fourth plurality or set of commands after the electronic key is being used by an end user and a countdown timer or down counter inside the electronic key indicates that a predetermined time period or a predetermined number of commands has been received by the electronic key.

Programmable Time Base Circuit with Protected Internal Calibration

FIG. 2.1

Referring now to FIG. 2.1, there is illustrated a schematic block diagram of a time base circuit 2.10 according to innovative teachings disclosed herein. The time base circuit 2.10 utilizes an analog oscillator 2.11 which is operable to generate a frequency on the output thereof of approximately 2.1 KHz in the preferred embodiment. However, the oscillator 2.11 could operate at any frequency. This is provided on an output node 2.12. The oscillator 2.11 receives its power from an internal battery 2.14 which supplies battery power to a node 2.16. The oscillator 2.11 is also operable to receive an oscillator enable signal OSCEN on an input line 2.18, which enable signal initiates operation of the oscillator 2.11, as will be described in more detail hereinbelow.

The output of the oscillator 2.11 is input to a modulo N counter 2.20. The modulo N counter 2.20 is programmable in accordance with the data stored in a calibration register 2.22. The contents of the calibration register 2.22 are input to the modulo N counter 2.20 on a bus 2.24. The contents of the calibration register 2.22 are input thereto through a fuse gate circuit 2.26 which is interfaced with the register 2.22 through a bus 2.28. The fuse gate circuit 2.26 is connected to exterior circuitry (not shown) through a bus 2.30.

The modulo N counter 2.20 is operable to be programmed to output a stable clock frequency that has a period equal to 2.82.4 ms in the preferred embodiment. This is a calibrated output that compensates for any variations in the frequency of the oscillator 2.11. As will be described in more detail hereinbelow, the battery 2.14, which, in the preferred embodiment, is a lithium battery internal to the system, is connected to the oscillator 2.11 during manufacture, and the frequency of the oscillator 2.11 is measured during calibration. The appropriate value for "N" which is the number to be programmed into the Modulo N counter 2.20 is then determined and input to the calibration register 2.22. Additional tests are then preformed and then the fuse gate 2.26 is opened to inhibit further alteration of the value of "N". This is a manufacturer calibration and cannot be changed by a customer nor can it be changed by the manufacturer, since the fuse is permanently opened. This is described in more detail in the parent application entitled "ELECTRONIC KEY LOCKING CIRCUITRY," which describes the overall system aspects.

It should be noted that the battery voltage of the battery 2.14 is the voltage that the system will see in the field during operation. This is to be compared with a calibration system wherein calibration is performed on a test bench using a power supply voltage which may be different than the test voltage. Since the battery used to calibrate the system is in fact the same battery utilized during operation of the system, there is minimal deviation of the oscillator frequency on the output node 2.12 which might otherwise be caused by a change in the battery voltage. As is described in detail hereinbelow, the modulo N counter 2.20 provides a method to calibrate the output of the oscillator 2.11 to provide a stable output frequency that compensates for variations incurred during fabrication of the oscillator 2.11 and variations of the battery voltage that is applied to node 2.16.

The output of the modulo N counter 2.20 is input to a twenty-bit ripple counter 2.32, which ripple counter 2.32 provides an output frequency that has a period equal to one day. This is therefore referred to as the "day counter." The output of the ripple counter 2.32 is then input to a countdown counter 2.34 which is a counter that is programmable by the customer and provides a division factor of anywhere from one to 2.512. The division factor is stored in a count set register 2.36 which is interfaced with the countdown counter 2.34 through a bus 2.38. The customer inputs the data that determines the division factor of the countdown counter 2.34 through a bus 2.40 which passes through a customer lock-out circuit 2.42 and into the count set register 2.36 through a bus 2.44. The customer lock-out circuit 2.42 is a gate which is controlled by a lock-out control signal.

In operation, the customer typically will input the division factor or count value into the count set register 2.36 and then activate the lock-out control signal. This will provide a predetermined countdown factor for countdown counter 2.34. This feature is also described in the parent application entitled "ELECTRONIC KEY LOCKING CIRCUITRY."

To help ensure that the entire system operates at a predetermined frequency and that the various calibration factors used to set the calibrated output frequency of the modulo N counter 2.20 and the count values for the countdown counter 2.34 are not disturbed, the battery node 2.16 is also connected to the calibration register 2.22, the ripple counter 2.32 and the countdown counter 2.34. This operational protection will be described in more detail hereinbelow.

The output of the countdown counter 2.34 is input into one input of a NOR gate 2.46, the output of which provides the inverse of the Timeout or Timeout-bar signal. The other input to the NOR gate 2.46 is connected to the output of an AND gate 2.48. The AND gate 2.48 has one input of which is connected to the oscillator enable signal on line 2.18 and the other input of which is connected to the output of a watch dog timer circuit 2.50. The watch dog timer circuit 2.50 has two inputs, one input of which is connected to the oscillator enable line 2.18 and the other input of which is connected to the output of the oscillator 2.11. The watch dog timer circuit 2.50 is operable during operation of the oscillator 2.11 to determine if the oscillator is working. If the oscillator 2.11 is determined not to be cycling for a predetermined duration of time, the watch dog timer circuit 2.50 changes the output thereof to a high logic level, thus causing the output of the AND gate 2.48 to go high. This is input to a reset input on countdown counter 2.34 through a line 2.52, which signal resets countdown counter 2.34 to a zero value, simulating a Timeout function. This causes the voltage on the Timeout-bar output to change states as if the countdown counter 2.34 had timed out. Thus, if an unauthorized operator tries to bypass the security feature of limiting the amount of time that the associated circuitry, such as a software protection key system, is operative, the watchdog timer circuit 2.50 will cause the time base circuit 2.10 to timeout within a few cycles of when the oscillator circuit 2.11 stopped.

Once the time base circuit 2.10 has timed out, there is no way to reset the counter 2.34 to an initial count if the customer lock out has been set. If the fuse gate circuit 2.26 has been set by the circuit manufacturer before shipment to the original equipment manufacturer (OEM), the OEM sets the days in the countdown counter 2.34 and then the OEM sets the customer lock out 2.42. Once the fuse gate circuit 2.26 has been set, the customer lockout 2.42 cannot be unlocked once it is locked. Also, customer lockout comes up locked on power up, so disconnecting of battery 2.14 does not unlock the customer lockout 2.42. The combination of the oscillator 2.11, modulo N counter 2.20 and ripple counter 2.32 provide a time base of one day. This output is then input to the countdown counter 2.34 that is initiated at a presettable value and then counts down to a value of zero. When it reaches a value of zero, the output changes state and the countdown counter ceases to count. This provides the Timeout function of the circuit of FIG. 2.1.

Referring now to FIG. 2.2, there is illustrated a detailed schematic diagram of the analog oscillator 2.11, wherein like numerals refer to like parts in the various figures. The oscillator 2.11 is basically configured of a comparator which utilizes two differential N-channel transistors 2.54 and 2.56, transistor 2.54 representing the negative input and transistor 2.56 representing the positive input. The transistor 2.54 has the gate thereof connected to a node 2.58, the source thereof connected to a node 2.60 and the drain thereof connected to a node 2.62. Transistor 2.56 has the gate thereof connected to a node 2.64, the source thereof connected to the node 2.60 and the drain thereof connected to a node 2.66. Node 2.60 is connected to a node 2.68 through the source-to-drain path of an N-channel transistor 2.70. Node 2.68 is then connected to ground through the source-to-drain path of an N-channel transistor 2.72.

Node 2.62 is connected to the battery node 2.16 through a P-channel transistor 2.74. Nodes 2.60, 2.66 and 2.68 are also connected to battery node 2.16 through P-channel transistors 2.76, 2.78 and 2.80, respectively. The gates of transistor 2.74-80 are connected to the oscillator enable terminal 2.18 which, when at a logic high voltage, renders the transistors 2.74-80 non-conducting. The operation of these transistors will be described in more detail hereinbelow.

In the operating mode with the oscillator signal OSCEN at a logic high voltage, node 2.62 is connected through a P-channel load transistor 2.82 to the battery node 2.16 with the gate of transistor 2.82 connected to the drain thereof, and the source of transistor 2.82 connected to the battery node 2.16. In a similar manner, node 2.66 is connected through the source-to-drain path of a P-channel transistor 2.84 to the battery node 2.16 with the gate of transistor 2.66 connected to node 2.62. Node 2.66 represents an output node; which node drives the gate of a P-channel transistor 2.86, the source of which is connected to the battery node 2.16 and the drain of which is connected to a node 2.88. Node 2.88 is connected through the source-to-drain path of a P-channel transistor 2.90 to the battery terminal 2.16, the gate of transistor 2.90 being connected to the oscillator enable terminal 2.18 and operating similar to transistors 2.74-80. Node 2.88 is also connected to node 2.68 through the source-to-drain path of an N-channel transistor 2.92, the drain of which is connected to node 2.88, the source of which is connected to node 2.68 and the gate of which is connected to a node 2.94. Node 2.94 is connected to the gate of transistor 2.70 and to the drain and gate of an N-channel transistor 2.96. Transistor 2.96 has the drain thereof connected to node 2.68 and operates as a portion of a current mirror.

Transistor 2.96 operates as a current source and is mirrored over to transistors 2.70 and 2.92. A series resistance is provided between the battery terminal 2.16 and the node 2.94 with four series connected resistors 2.98, 2.100, 2.102 and 2.104. For selection purposes, a P-channel transistor 2.106 is connected between battery node 2.16 and the junction of transistors 2.98 and 2.100, a P-channel transistor 2.108 is connected between the battery node 2.16 and the junction of transistors 2.100 and 2.102. A P-channel transistor 2.110 is connected between the battery node 2.16 and the junction of transistors 2.102 and 2.104. Transistors 2.106–2.110 provide the capability to select a series configuration equal to the series combination of all four resistors 2.98–2.104 or 2.100–2.104 or 2.102–2.104 alone. This provides an adjustment to the overall current drawn by the oscillator 2.11.

The negative input terminal of the comparator on the gate of transistor 2.54 is connected to a voltage divider provided by a first series resistor 2.112 connected between node 2.58 and the battery node 2.16 through the source-to-drain path of a P-channel transistor 2.114. The gate of P-channel transistor 2.114 is connected through an inverter 2.116 to the oscillator enable terminal 2.18. The second portion of the voltage divider is provided by a series resistor 2.118, which is connected between the node 2.58 and a node 2.68 through an N-channel transistor 2.120. Transistor 2.120 has the gate thereof connected to the oscillator enable terminal 2.18. When the OSCEN signal is high, transistor 2.114 and transistor 2.120 conduct, thus placing resistors 2.112 and 2.118 between the battery terminal 2.16 and ground through transistor 2.72. The resistance of transistors 2.114, 2.120, and 2.72 when they are on are each much less than the resistance of resistor 2.112 or resistor 2.118.

The positive input terminal of the comparator on the gate of transistor 2.56 is switchably connected to ground through a timing capacitor 2.122, which capacitor has one end thereof connected to node 2.64 and the other end thereof connected to node 2.68, node 2.68 being connected to ground through transistor 2.72 when the oscillator enable signal is high on terminal 2.18. Node 2.64 is also connected through a P-channel transistor 2.124 to an external resistor 2.126, which resistor 2.126 has the other end thereof connected to the battery node 2.16. The gate of transistor 2.124 is connected to the output of inverter 2.116, such that transistor 2.124 conducts when the oscillator enable (OSCEN) signal is high. It should be noted that when the oscillator enable signal 2.18 is low, all of the nodes in the comparator circuit are pulled high. This is important in that the comparator starts at a predetermined voltage on the output thereof and to assure that the same bias conditions are placed on matched transistors (e.g., current mirror) so that any $V_T$ or other parametric drifts due to aging will track on matched transistors.

The output of the comparator on node 2.88 is connected through two series inverters 2.128 to a node 2.130. Node 2.130 is connected to one input of a three input NAND gate 2.132 and also through an inverter 2.134 to a second input of NAND gate 2.132. A capacitor 2.136 is connected between the output of inverter 2.134 and ground. The third input of NAND gate 2.132 is connected to an external signal OSCSTOPB, which signal provides an external oscillator halting function. The NAND gate 2.132 has the output thereof connected to one input of a NAND gate 2.138, the other input of which is connected to the oscillator enable signal 2.18, and, therefore, operates as a gate. The output of NAND gate 2.138 is connected to the gate of an N-channel transistor 2.140, the source of which is connected to ground and the drain of which is connected to node 2.64. Transistor 2.140 is operable to discharge capacitor 2.122 and provides a feedback path for the oscillator. The NAND gate 2.132, associated capacitor 2.136 and inverters 2.128 and 2.134 provide a one-shot function which has a period of approximately three microseconds.

A capacitor 2.142 is connected between Node 2.58 and node 2.68 to provide some common mode rejection. Node 2.58 is also connected to ground through an N-channel transistor 2.144, the gate of which is connected to the output of inverter 2.116, such that transistor 2.144 conducts when the of the oscillator enable (OSCEN) signal on line 2.18 is at ground potential.

The output of the oscillator 2.11 at the output of NAND gate 2.132 and NAND gate 2.138 is buffered by a level shifting circuit. The level shifting circuit is comprised of two N-channel transistors 2.146 and 2.148, each having the sources thereof connected to ground and the gates thereof connected to the output of NAND gates 2.132 and 2.138, respectively, and the drains thereof connected to cross-coupled nodes 2.150 and 2.152. Node 2.150 drives the gate of a P-channel transistor 2.154, transistor 2.154 having the drain thereof connected to node 2.152 and the source thereof connected to a node 2.156. Node 2.152 drives the gate of a P-channel transistor 2.158, the source of which is connected to node 2.150 and the drain of which is connected to node 2.156. Node 2.156 is connected through a P-channel transistor 2.160 to a terminal $V_{CC0}+$. Transistor 2.160 has the gate thereof connected to the output of inverter 2.116 such that it conducts when the oscillator enable signal is present on terminal 2.18 is high. The voltage $V_{CC0}+$ is a voltage that represents the higher of either the battery terminal voltage or the external supply voltage for the chip to which the time base is connected by circuitry not shown in the drawings. This allows the output voltage to be the higher of the two so as not to cause current burn in the gates of transistors driven by the oscillator signal on terminal 2.12, since these transistors may be powered by $V_{CC}$ potential of up to five volts whereas the signals on the outputs of NAND gates 2.132 and 2.138 only rise to a battery potential of approximately three volts. This is described in the parent application entitled "ELECTRONIC KEY LOCKING CIRCUITRY". Node 2.152 represents the output OSC and is coupled to the terminal 2.12 and is buffered by two series connected inverters 2.162.

The watchdog timer 2.50 circuit is connected between the output of the NAND gate 2.138 and the OSCOKB signal on an output line 2.164. The watchdog timer has a timing capacitor 2.166, which is connected between a node 2.168 and ground. Node 2.168 is connected to ground through the source-to-drain path of an N-channel transistor 2.170, which transistor 2.170 has the gate thereof connected to the output of NAND gate 2.138 and conducts every cycle of the oscillator to discharge the capacitor 2.166. Node 2.168 is also connected to the terminal $V_{cc0}+$ through two series connected P-channel transistors 2.172 and 2.174. Transistor 2.172 has the gate thereof connected to ground and transistor 2.174 has the gate thereof connected through an inverter 2.176 to the oscillator enable signal on terminal 2.18. Node 2.168 is connected to terminal 2.164 through two inverters 2.178.

In operation, watchdog timer 2.50 circuit is operable to discharge the capacitor 2.166 and maintain the output thereof low as long as the oscillator 2.11 is cycling. However, if a predetermined number of cycles have not occurred, determined by the RC time constant of the two series connected transistors 2.172 and 2.174 and the capacitor 2.166, the output voltage on terminal 2.164 will increase to a sufficient level to trigger additional logic circuitry described hereinbelow. It is important to note that the watchdog timer circuit 2.50 is connected after the one shot circuit at the output of NAND gate 2.132, and as such, the output of NAND gate 2.138 cannot be held high by manipulating the input pins to the comparator circuit in the oscillator 2.11 which would cause the output of the watchdog timer circuit 2.50 to always be low. In addition, when the oscillator enable signal on terminal 2.18 is low, this will result in transistor 2.174 being turned off and transistor 2.170 being turned on. Transistor 2.170 is turned on due to the fact that NAND gate 2.138 has a logic high on the output thereof. This combination allows a watchdog timer circuit to be enabled from a starting condition of a low-voltage on the capacitor 2.166.

FIG. 2.3

Referring now to FIG. 2.3, there is illustrated a logic diagram of the modulo N counter 2.20 and the associated calibration register 2.22, wherein like numerals refer to like parts in the various figures. The modulo N counter is configured from a plurality of D-type flip flops which are configured to provide a serial binary counter. The flip flops 2.180 are represented by a reference numeral 2.180. Each of the flip flops 2.180 are arranged in a serial configuration with the Q-bar output connected to the clock input of the next sequential D-type flip flop 2.180. The Q-bar output is also connected back around to the data input of the associated flip flop. The clock input of each of flip flops 2.180 is connected to the clock bar through an inverter 2.182. The first flip flop 2.180 in the serial configuration is connected to the oscillator output OSC on the terminal 2.12. In the preferred embodiment, there are eight bits or flip flops 2.180 of Modulo N counter 2.20.

The calibration register 2.22 is configured with a plurality of D-type flip flops 2.184, one flip flop 2.184 associated with each of the flip flops 2.180. The D-type flip flops 2.184 are arranged in a serial configuration to serially clock data therethrough with the Q-output of each flip flop 2.184 connected to the data input on the next sequential flip flop. The flip flops 2.184 merely function to store a serial stream of data. The clock input of each of the flip flops 2.184 is connected to a clock line 2.186 and the clock-bar input of each of the flip flops 2.184 is connected to the clock line 2.186 through an inverter 2.188. The reset inputs of the flip flops 2.184 are connected to the signal RC, which is an external reset signal, on line 2.190, which signal is utilized in the initial set up of the time base circuit.

The clock line 2.186 is connected through an inverter 2.192 to the signal SRCLK. This signal allows the clock signal CLK to be passed through to the clock inputs of the flip flops 2.184 at the appropriate time to load the shift register with data. A serial stream of data DIN is input to the data input of the first of the flip flops 2.184 in the string. This data is synchronized with the clock signal SRCLK and can be serially fed into the flip flops and stored therein. The flip flops 2.184, although not shown in FIG. 2.3, are connected to the battery node 2.16 to provide a storage function of the battery voltage.

The Q-bar output of each of the flip flops 2.184 and the Q-bar output of each one of the flip flops 2.180 that is associated therewith are input to the inputs of an Exclusive NOR gate 2.202. The Exclusive NOR gate 2.202 has the output thereof connected to one input of a two-input NAND gate 2.204, the other input thereof connected to the output of inverter 2.206. The inverter 2.206 associated with the first of the associated flip flops 2.184 and 2.180 in the serial string has the input thereof connected to ground. Thereafter, the inverter 2.206 has the input thereof connected to the output of the preceding one of the NAND gates 2.204. The output of the last of the NAND gates in the serial string is connected to the input of an inverter, which drives the input of a rising edge triggered one shot.

Each of the circuits comprising the exclusive NOR gate 2.202, the NAND gate 2.204 and the inverter 2.206 is operable to function as a detect circuit. Each of the bits stored on the outputs of the flip flops 2.184 is compared with the logic state on the output of each of the flip flops 2.180 associated therewith. When a match exists, the output of the associated Exclusive NOR gate 2.202 goes high, and, if the preceding bits are also matched, this results in a logic high present on both inputs of the associated NAND gate 2.204. When a comparison is made for all bits, the output of inverter 2.208 goes high, indicating the maximum count for the counter.

The output of the inverter 2.208 is connected to the input of a one-shot 2.212, which has the output thereof connected to one input of a NAND gate 2.214 through an inverter 2.216. The output of the one-shot 2.212 also comprises the output of the circuit CLKOUT. The other input to the NAND gate 2.214 is connected to the clock signal RC through an inverter 2.210. The output of NAND gate 2.214 is connected to the reset inputs of the flip flops 2.180.

When the output of the inverter 2.208 goes high, the output of the one-shot 2.212 is a high going pulse which resets the flip flops 2.180 and reinitiates the sequence of counting in flip flops 2.180. The output of one-shot 2.212 provides the output signal CLKOUT, which signal clocks the remaining circuits of the chain. The one-shot 2.212 could be fabricated in a number of different ways, including having inverter 2.208 cause the output of the one-shot 2.216 to go high and having the output signal cause the output of the one-shot 2.216 to go low after one half or even one clock cycle.

During calibration, the flip flops 2.184 are loaded with the appropriate data through the DIN line. However, no data can be input thereto or stored on the outputs of flip flops 2.184 until a clock signal is present on line 2.186. This is facilitated by appropriate gating circuitry. Although not shown, this is controlled by a fuse circuit as disclosed in parent application "ELECTRONIC KEY LOCKING CIRCUITRY." However, the gating circuit allows independent control of data storage by inhibiting loading thereof during normal operation. This is only accessible by the manufacturer for calibration purposes only. This therefore provides a stable clock output which has a predetermined period which is determined as a function of measuring the output of the oscillator 2.11 and then storing a predetermined data word in the output of flip flops 2.184.

FIG. 2.4

Referring now to FIG. 2.4, there is illustrated a logic diagram of the ripple counter 2.32, wherein like numerals refer to like parts in the various figures. The signal CLKOUT is input to the input of an inverter 2.228, the output of which is coupled to the clock input of one of a plurality of flip flops 2.230 connected in a serial fashion as a binary counter. Each of the flip flops 2.230 has the Q-bar output thereof connected back to the data input thereof and also connected to the clock input of the next sequential one of the flip flops 2.230 in the series. The Q-outputs are connected to the clock bar inputs of the next sequential one of the flip flops 2.230 with the clock input of the first of the flip flops 2.230 connected through an inverter 2.232 to the output of inverter 2.228 and a clock-bar input connected to the output of the inverter 2.228. The output of the last of the flip flops 2.230 on the Q-bar output thereof comprises the output signal DCLK, which signal is then input to the countdown counter 2.34.

FIG. 2.5

Referring now to FIG. 2.5, there is illustrated a logic diagram of the countdown counter 2.34, count set register 2.36 and customer lock-out function 2.42, wherein like numerals refer to like parts in the various figures. The countdown counter 2.34 is comprised of a plurality of D-type flip flops 2.240 which are configured in a presettable mode. In the preferred embodiment, the flip flops 2.240 are set/reset D-type flip flops. The first of the flip flops 2.240 in the string has the clock input thereof connected through an inverter 2.242 to the output of a NOR gate 2.244. The NOR gate 2.244 is connected to the DCLK signal which is output from the ripple counter 2.32 of FIG. 2.4. The other input of the NOR gate 2.244 is connected to the reset input of the first flip flop 2.240. The Q-bar output of each of the flip flops in the string is connected back to the data input thereof and also to the clock input of the next sequential one of the flip flops 2.240. In a similar manner, the Q-output of each of the flip flops is connected to the clock bar input of each of the succeeding flip flops. The Q-bar output of the last of the flip flops 2.240 and the associated Q-output are connected to the clock and clock bar outputs of a D-type flip flop 2.246, which is similar to the flip flops 2.240 with the exception that the D-input thereof is connected to the voltage $V_{CC0+}$.

Each of the flip flops 2.240 has the set input thereof connected to the output of an associated NOR gate 2.248. One input of each of the NOR gates 2.248 is connected to the output of a NAND gate 2.250. The NAND gate 2.250 functions to enable the setting of flip flops 2.240 in response to the presence of a signal WRDC. The other input of each of the NOR gates 2.248 is connected to the output of a three-input NAND gate 2.252. The NAND gate 2.252 functions as a decoder.

The NAND gates 2.252 associated with each of the flip flops 2.240 are operable to decode a three-bit word C0, C1, C2. The three-bit C0–C2 are input to a plurality of lines 2.254, which lines comprise both the true and the false or inverse value of the three-bit word, the inverse value being provided by inverters 2.256. The interconnections of the three-inputs on the NAND gates 2.252 provide the decoding function. The three-bit word C0–C2 is generated internally from a counter clocked by the signal CLK. The decoding of C0–C2 successively allows setting of flip flops 2.240 which are all reset before setting occurs. Note that the counter is an up counter. A countdown function is created by setting the counter to the one's complement of days to be counted down and then counting up to an all one's condition or, more precisely, a roll over to all zero's from an all one's one clock cycle later. The one's complementing of data is accomplished by NAND gate 2.250 which presents DIN to NOR gates 2.248 when enabled.

The output of the last or most significant bit flip flop 2.240 is operable to clock the flip flop 2.246 and latch the high-voltage on the data input to the Q-output thereof. The Q-output thereof is connected to one input of the NOR gate 2.48, the other input of which is connected to the output of a NAND gate 2.260 through an inverter 2.262. The NAND gate 2.260 and inverter 2.262 are operable to receive the oscillator enable signal OSCEN and the output of the watchdog timer 2.50 OSCOKB such that if both signals go high meaning the oscillator is enabled and the watchdog signal has gone high, the input to the NOR gate 2.48 associated therewith goes high. When the oscillator enable signal OSCEN is high and the output signal OSCOKB from the watchdog timer is low, the output of the inverter 2.262 remains low. When the OSCOKB signal on the input of NAND gate 2.260 goes high, the output of inverter 2.262 goes high which is operable to change the output of NOR gate 2.46 from a high to a low voltage.

The output of inverter 2.262 is also input to the set input of flip flop 2.246, which causes the Q-output thereof to go high when the set input goes high. In operation, as long as the two inputs to the NAND gate 2.260 are high, the only way for the output signal, which is referred to as Timeout-bar, to go from a logic high to a logic low is for the Q-output thereof to change state from a low to a high. Initially the flip flop 2.246 is set low by a reset circuit that is connected to the reset input, which signal is a one shot pulsed high at the beginning of the Write Counter mode (WC) of operation. Writing of the counter can be disabled by an input data stream. Additionally, the output of one-shot 2.264 is connected to the reset inputs of all the flip flops 2.240 through a series-connected NOR gate 2.266 and inverter 2.268. Therefore, writing the counter will first reset all of the flip flops 2.240 and 2.246 to logic zero at the Q-outputs thereof. The other input of the NOR gate 2.266 is connected to the Q-output of the flip flop 2.246, such that when the counter 2.34 has "timed out", the remaining flip flops 2.240 are reset to a zero value (or held at zero value since this is where they are) with the exception of the flip flop 2.246 which remains at a high value on the Q-output thereof. As long as the high value remains on the Q-output of flip flop 2.246, the Timeout-bar signal will be low. Thus, Timeout-bar is normally caused by the day counter counting out, but will also be forced to count out if the oscillator 2.11 stops oscillating when it is disabled—an indication of tampering. Also, flip flop 2.246 powers up with Q high so that disconnecting and reconnecting the battery (tampering) will cause the part to time out.

In summary, there has been provided a Timeout circuit which includes an analog oscillator for generating an initial operating frequency. The oscillator is driven by an internal battery, the oscillator output being a function of the battery voltage. The frequency of the oscillator is then measured and input to a modulo N counter which is interfaced with a calibration register having the value of N stored therein. The value of N is selected to output a predetermined frequency in which variations in the oscillator output frequencies have been compensated for, which variations are due to manufacturing tolerances, battery voltage output, etc. After calibration, the value is then locked into the calibration register and tampering therewith is inhibited. The output of the modulo N counter is an input to a countdown counter, which has a countdown value that is set by an OEM customer. The counter is operable to have the contents protected from tampering once set.

Secure Interface

FIG. 3

A block diagram of an electronic key system containing an electronic key 3.10 in accordance with the present invention is shown in FIG. 3. Also shown is a central processing unit (CPU) 3.14 which has connected to it a parallel port connector 3.16 through which passes a plurality of data lines and other signal lines 3.17. Connected to the parallel port connector 3.16 is an interface circuit or key ring 3.18. Connected to the output of the key ring 3.18 is another parallel port connecter 3.19 which in turn is shown connected to a printer 3.20. Connected between the key ring 3.18 and the electronic key 3.10 are four lines: a clock line 3.22, a data line 3.24, a reset-bar line 3.26, and a ground line 3.28.

Three of the four lines, the clock line 3.22, the reset-bar line 3.26 and the ground line 3.28 are connected to a control logic circuit 3.30 within the electronic key 3.10. Four outputs of the control logic circuit 3.30 are connected to a four conductor line 3.32. The first of these outputs is connected to the input of a 64 bit identification register 3.34; the second output is connected to the input of a 64 bit password register 3.36; the third output is connected to the input of a 128 bit secure memory 3.38; and the fourth output is connected to the input of a command register 3.40. The data line 3.24 is connected to the output of the 64 bit identification register 3.34, to a first input of a compare register 3.44, to a bidirectional input/output terminal of the 128 bit secure memory 3.38, to a second input of the command register 3.40, and to the output of a random number generator circuit 3.42. The output of the 64 bit password register 3.36 appears on line 3.46 which in turn is connected to the input of the compare register 3.44. A first output of the command register 3.40 appears on line 3.48 which is connected to a second input of the 128 bit secure memory 3.38. The output of the compare register 3.44 appears on line 3.50 which is connected to another input of the control logic circuit 3.30. A second output of the command register 3.40 appears on line 3.52 which is connected to still another input of the control logic circuit 3.30. A fifth output of the control logic circuit 3.30 appears on line 3.54 which is connected to the input of the random number generator circuit 3.42.

In the preferred embodiment, the data lines and other signals contained within the parallel port connector 3.16 out of the CPU 3.14 are passed directly to the printer 3.20 with the exception of the SLCTIN signal in the parallel port connector 3.16 which is used to provide data to and from the electronic key 3.10 on line 3.24. Since the SLCTIN signal is generally not used by peripheral printers, the key ring 3.18 directs this SLCTIN signal directly to line 3.24 leading into the electronic key 3.10 and disconnects the SLCTIN signal line from the peripheral device 3.20.

The other three lines, the clock line 3.22, the reset-bar line 3.26 and the ground line 3.28, are tapped off lines which are connected between the CPU 3.14 and the printer 3.20. The clock line 3.22 in the preferred embodiment is tapped off the line commonly known in the computer industry as the data out 3.3 (D3) line, and the reset-bar line 3.26 is tapped off the line commonly known as the data out 3.2 (D2) line. The ground line 3.28 is the standard ground line in the parallel port connector 3.16.

Although not shown in FIG. 3 nor discussed in detail for the sake of brevity, it will be understood that the electronic key ring 3.18 can be suitably modified by means known to those skilled in the art for use in virtually any communications path such as the communications path between the CPU 3.14 and a nonvolatile memory device, for example a ROM, inside of the CPU 3.14; or attached to an RS232 serial port. In at least some of these configurations the electronic key ring 3.18 would require an additional predetermined serial bit stream from the CPU 3.14 to signal the electronic key ring 3.18 to route certain signal lines to circuitry embodied within the electronic key 3.10 rather than through the normal communication channel.

With reference again to FIG. 3, when the CPU 3.14 wishes to read from or write to the 128 bit secure memory 3.38 of the electronic key 3.10, the CPU 3.14 first provides a serial bit stream of 24 protocol bits to the data line 3.24 to activate the key and to indicate to the electronic key 3.10 to either receive data or to write data back to the CPU 3.14. The transfer of the 3.24 protocol bits, identification bits, password bits and data bits are clocked into and out of the electronic key 3.10 by the CPU 3.14 which provides a clock signal on the clock line 3.22 (which, as previously noted, is the D3 line of the parallel port connector 3.16). Prior to transmission of the 24 protocol bits, the reset-bar line 3.26 must first be held low and then raised to a logic 1 to reset the electronic key 3.10 and to provide power to the electronic key 3.10. The reset-bar line 3.26 must be held high during the entire data transfer procedure.

The 24 protocol bits are transferred into the command register 3.40, and the command register 3.40 determines if the 24 protocol bits are an acceptable read or write command for the electronic key 3.10. The result of this determination is provided to the control logic circuit 3.30 on the output line 3.52 of the command register 3.40. If the 24 protocol bits are not acceptable, then the electronic key 3.10 ignores all additional data on the data line 3.24 until the reset-bar line 3.26 is again brought low and then high again. Once an acceptable 24 protocol bits have been received by the electronic key 3.10, the control logic circuit 3.30 signals the 64 bit identification register 3.34 to transfer the 64 bits of an identification code (which are stored in the 64 bit identification register 3.34) onto the line 3.24, and thus to the CPU 3.14.

Following the transfer of this 64 bits of identification data from the key, a password or access code of 64 bits is sent on data line 3.24 from the CPU 3.14 to the electronic key 3.10. This password is compared by the compare register 3.44 to the password stored in the 64 bit password register 3.36. The compare register 3.44 places a signal on line 3.50 to indicate to the control logic circuit 3.30 if the password received is valid or not. If the password is not valid, and if the protocol request was for the electronic key 3.10 to transfer data to the CPU 3.14, then the control logic circuit 3.30 signals the random number generator circuit 3.42 to place 128 bits of random data on the data line 3.24. If the password is not correct and the protocol request was to write data from the CPU 3.14 to the 128 bit secure memory 3.38 of the electronic key 3.10, then the data from the CPU 3.14 will be ignored. But if the password is valid for a read operation, then the electronic key 3.10 will send the 128 bits of data stored in the 128 bit secure memory 3.38 to the CPU 3.14; and for a write operation the 128 bit secure memory 3.38 will receive 128 bits of data from the CPU 3.14.

The circuitry for each of the circuit blocks contained in the electronic key 3.10 shown in FIG. 3 are well known in the art, although in the preferred embodiment a novel circuit for the random number generator circuit 3.42 is shown in the patent application listed in the Reference to Related Applications section above. However, it will be understood that the term "random data" as used herein includes not only random data in the strict mathematical sense, but also data which is essentially random, but not strictly random; data which is pseudorandom data; data which is essentially garbled data; or data which is uniquely determined by the invalid password such as encrypted data derived at least in part from the password.

Thus the electronic key 3.10 shown in FIG. 3 is able first to recognize a protocol command from a CPU 3.14; secondly, to provide an identification code of the key to the CPU 3.14 for verification by the CPU 3.14 software that a valid key is attached to the CPU 3.14; thirdly, to accept and verify a password from the CPU 3.14; fourthly, to send random data to the CPU 3.14 or to ignore data sent from the CPU 3.14 if the password is incorrect; and finally, if the password is correct, to send secure data from the key to the CPU 3.14, which the CPU 3.14 may use in different ways, or to receive secure data from the CPU 3.14.

In order for the full security offered by the use of random data to be realized, the software in the CPU needs to issue a plurality of false passwords to the electronic key 3.10 with a read request protocol so that an authentic request will be only one of several requests.

Also, the random number generation feature of the electronic key 3.10 may be used to provide random numbers for the software for uses unrelated to data security.

Thus, an electronic key has been described which has enhanced security by the operation of returning random data when a read instruction accompanied by an invalid password is received by the electronic key.

Fusing and Detection Circuit

The fusing and detection circuit of the present invention provides a fuse element, supporting circuitry to blow the fuse, and also includes circuitry for detecting whether the fuse has been blown. In addition, the fusing and detection circuitry of the present invention is configured in such a manner that it is not readily susceptible to a combination of steady-state voltages or voltage transients applied to the pins of the integrated circuit which would cause the detection circuit to indicate at its output terminal that the fuse had not been blown when, in fact, the fuse had been blown.

To illustrate an advantage of the present invention, in another type of fusing and detection circuit, the fusing element is a diode that is a normal p-n junction in its unblown state and is essentially a short in its blown state, and this fuse diode is connected to a pullup resistor and to the input of an inverter circuit such that the diode, before being blown, is reverse biased and the input voltage to the inverter circuit is therefore at a logic 1 level. The fuse is blown by applying a suitable voltage and current from an external pin of the integrated circuit connected to the node between the diode and the pullup resistor. After the fuse is blown, the input to the inverter would be a logic 0 level. However, the effect of the fuse can be overridden by applying a positive voltage to the fuse input terminal to force the input of the inverter to a logic 1 level. Thus, this simple circuit is susceptible to a positive voltage being applied to the fusing pin which causes the inverter output to indicate that the fuse had not been blown, when, in fact, it had been blown.

FIG. 4.1

Turning now to the drawings, a fusing and detection circuit according to innovative teachings disclosed herein is shown generally as element 4.10 in FIG. 4.1. An input signal, RST*, applied to an RST* input terminal 4.12 is used to provide a positive supply voltage for the fusing and detection circuit 4.10 in the preferred embodiment. The RST* signal also provides power to the rest of the integrated circuit containing the fusing and detection circuit 4.10 when the RST* signal is greater than the voltage from a backup battery connected to the integrated circuit. When the RST* voltage is less than the battery voltage, then the battery voltage is used to provide power to the portions of the integrated circuit which must function at all times, such as the portions in which permanent data is stored. The substrate of the integrated circuit is biased with either the RST* voltage or the battery voltage, whichever voltage is more positive.

The RST* input terminal 4.12 is connected to the source of a first p-channel transistor 4.14, to the source of a second p-channel transistor 4.16, to the gate of an n-channel transistor 4.18, to the source of a third p-channel transistor 4.20, to the gate of another n-channel transistor 4.22, and to the drain of a third n-channel transistor 4.24. The RST* signal at the RST input terminal 4.12 also provides a positive supply voltage to a comparator 4.26.

A second input to the fusing and detection circuit 4.10 is a fuse input terminal 4.28. The fuse input terminal 4.28 is connected to one end of a poly resistor 4.30, the other end of which is connected to ground. The fuse input terminal 4.28 is also connected to the drain and gate of an n-channel transistor 4.32, the source of which is connected to one end of another poly resistor 4.34, to one end of a third poly resistor 4.36, and to the cathode of a fuse diode 4.38. The n-channel transistor 4.32 is set in a p— well which is a floating p— well, i.e., not connected directly to any other nodes in the integrated circuit. The other end of the poly resistor 4.34 is connected to the drain of the p-channel transistor 4.14 and the drain of the p-channel transistor 4.16. The gate of the p-channel transistor 4.16 is connected to ground. The other end of the poly resistor 4.36 is connected to the gate of the n-channel transistor 4.24. The source of the n-channel transistor 4.24 is connected to the drain of the n-channel transistor 4.18 and also connected to a plus input of the comparator 4.26. The anode of the fuse diode 4.38 is connected to the drain of the n-channel transistor 4.22, to a minus input of the comparator 4.26, to the drain of another n-channel transistor 4.40, and to one end of a poly resistor 4.42, the other end of which is connected to the drain of the p-channel transistor 4.20. The source of the n-channel transistor 4.22 and the source of the n-channel transistor 4.40 are connected to ground.

A third input to the fusing and detection circuit 4.10 is a lock set input terminal 4.44 which is connected to the input of an inverter 4.46 and to the gate of an n-channel transistor 4.48. The output of the inverter 4.46 is connected to the gate of the p-channel transistor 4.14 and to the gate of the p-channel transistor 4.20. The source of the n-channel transistor 4.48 is connected to ground. The drain of the n-channel transistor 4.48 is connected to the gate of the n-channel transistor 4.40, to the output of the comparator 4.26, and to the input of an inverter 4.50, the output of which forms the lock signal at a lock output terminal 4.52.

FIG. 4.2

The lock set signal applied to the lock set input terminal 4.44 of FIG. 4.1 is formed at the output of a NAND gate 4.54 of FIG. 4.2. As shown in FIG. 4.2 the RST* signal from the RST* input terminal 4.12 is connected to three circuits. The first circuit is a voltage level detection circuit which is contained within the dashed outline 4.56 and which has an output on a line 4.57, the second circuit is a delay circuit which is contained within the outlined area 4.58 and which has an output on a line 4.59, and the third circuit is a comparator 4.60 which detects if the RST* signal is greater than the battery voltage which is applied to a VBAT input terminal 4.64 and which has an output on a line 4.61. Within the voltage level detection circuit 4.56, the RST* signal is connected to one end of a resistor 4.66, the other end of which is connected to the drain and gate of an n-channel transistor 4.68, the source of which is connected to ground. The drain of the n-channel transistor 4.68 is connected to the input of a first inverter consisting of an upper p-channel transistor 4.70 and a lower n-channel transistor 4.72. The source of the p-channel transistor 4.70 is connected to the RST* signal, and the source of the n-channel transistor 4.72 is connected to ground. The input of the inverter is connected to the gates of the p-channel transistor 4.70 and the n-channel transistor 4.72 and the common drain node of the p-channel transistor 4.70 and the n-channel transistor 4.72 forms the output which is connected to the input of a second inverter stage having an upper p-channel transistor 4.74 and a lower n-channel transistor 4.76. The output of this inverter stage is connected to the input of a third inverter stage having an upper p-channel transistor 4.78 and a lower n-channel transistor 4.80. The output of this third stage at the common drain connection of the p-channel transistor 4.78 and the n-channel transistor 4.80 is connected to the line 4.57 which in turn is connected to one input of the NAND gate 4.54.

The delay circuit 4.58 connects the RST* signal to the source of a p-channel transistor 4.82, the gate of which is connected to ground and the drain of which is connected to one end of a capacitor 4.84, the other end of which is connected to ground. The drain of the p-channel transistor 4.82 is connected to the anode of a diode 4.86, the cathode of which is connected to the RST* signal. The drain of the p-channel transistor 4.82 is also connected to the input of an inverter stage consisting of an upper p-channel transistor 4.88 having its source connected to the RST* signal, and a lower n-channel transistor 4.90 having its source connected to ground. The output of this inverter stage is connected to the input of a second inverter stage having an upper p-channel transistor 4.92 and a lower n-channel transistor 4.94. The output of this second inverter stage is connected to the line 4.59 which in turn is connected to a second input of the NAND gate 4.54.

The RST* signal is also connected to a plus input of the comparator 4.60 and also provides power to the comparator 4.60. A minus input of the comparator 4.60 is connected to the VBAT input terminal 4.64. The output of the comparator 4.60 is connected to the line 4.61 which in turn is connected to a third input of the NAND gate 4.54.

Operation

In operation, the fusing and detection circuit 4.10 of FIG. 4.1 is, in the preferred embodiment, designed to operate with a fusing diode 4.38 which is a normal p-n junction diode when fabricated, and when blown becomes a low resistance device. The lock output terminal 4.52 is a logic 0 level when the system is unlocked (before the fuse diode 4.38 has been blown, when it operates as a p-n junction), and a logic 1 level when the system is locked (after the fuse diode 4.38 has been blown or converted to a resistive element). The lock output terminal 4.52 will also be a logic 1 level when the lock set input terminal 4.44 is at a logic 1 level regardless of the condition of the fuse diode 4.38. Thus a logic 1 level at the lock set input terminal 4.44 operates to preset the fusing and detection circuit 4.10 to a locked state.

More specifically, when the lock set input terminal 4.44 is a logic 1 level, the n-channel transistor 4.48 will overdrive the output of the comparator 4.26 to a logic 0 level which will cause the output of the inverter 4.50 to be a logic 1 level to thus provide a logic 1 level at the lock output terminal 4.52. At the same time, the inverter 4.46 will enable or make conductive the p-channel transistor 4.20 which will conduct the RST* signal through resistor 4.42 onto the minus input of the comparator 4.26. While the n-channel transistor 4.22 is also enabled at this time by the application of the RST* signal on the gate of the n-channel transistor 4.22, it will be appreciated that the n-channel 4.22 is a low conductivity transistor and has an equivalent resistance which is much larger than the channel resistance of the p-channel transistor 4.20 and the resistance of the resistor 4.42, and therefore the minus input of the comparator 4.26 is held at a voltage approximately equal to the RST* signal voltage. The n-channel transistor 4.40 is disabled or made nonconductive since its gate is pulled to ground potential by the action of the n-channel transistor 4.48.

The inverter 4.46 also enables the p-channel transistor 4.14; and it and the p-channel transistor 4.16 provide a path for the RST* signal through the resistor 4.34, through the resistor 4.36 and onto the gate of the n-channel transistor 4.24. The source voltage of the n-channel transistor 4.24, which is applied to the plus input of the comparator 4.26, is the voltage at the cathode of the fuse diode 4.38, which is essentially the RST* signal voltage, minus the threshold voltage of the n-channel transistor 4.24. The n-channel transistor 4.18 has significantly less conductivity than the n-channel transistor 4.24. The n-channel transistor 4.18 and the n-channel transistor 4.22 operate as current sources to sink current from the plus and minus inputs respectively of the comparator 4.26. The n-channel transistor 4.32 is connected as a diode, and under normal operating conditions, in which the fuse input pin 4.28 is not connected to any external circuitry and the poly resistor 4.30 operates to pull the fuse input terminal 4.28 to ground potential, the diode formed by the n-channel transistor 4.32 will be reverse biased.

The fuse diode 4.38 prior to being blown, operates as a p-n junction device, and since the cathode is essentially at the RST* signal voltage and the anode is slightly less than the RST* signal voltage due to the action of the n-channel transistor 4.22, then virtually no current will flow through the fuse diode 4.38. Also, if the fuse diode 4.38 is blown such that it is a small impedance rather than a diode, then the amount of current flowing through the fuse diode 4.38 will cause the voltage at the minus input of the comparator 4.26 to be slightly lower than the voltage at the cathode of the fuse diode 4.38.

Under these conditions the minus input of the comparator 4.26 will be at a greater voltage than the positive input of the comparator 4.26 which will cause the comparator 4.26 to put a logic 0 level at its output terminal, which is the same logic level produced by the action of the n-channel transistor 4.48.

After the lock set node 4.44 switches from a logic 1 level to a logic 0 level, the lock output terminal 4.52 will remain at a logic 1 level if the fuse diode 4.38 has been blown and will switch to a logic 0 level if the fuse diode 4.38 has not been blown. If the fuse diode 4.38 has not been blown such that the fuse diode 4.38 operates as a p-n junction, then when the lock set node 4.44 switches to a logic 0 level, the output of the comparator 4.26 will not be held to ground by the n-channel transistor 4.48 since it will have become disabled, and the p-channel transistors 4.14 and 4.20 will also become disabled. The n-channel transistor 4.24, 4.18, and 4.22 will remain enabled and the plus input of the comparator 4.26 will remain at the RST* signal voltage minus the threshold voltage of the n-channel transistor 4.24. However, since the fuse diode 4.38 is reverse biased, and the p-channel transistor 4.20 is disabled, the n-channel transistor 4.22 will discharge the voltage on the minus input of the comparator 4.26 to pull the minus input of the comparator 4.26 toward ground potential. When the minus input voltage of the comparator 4.26 falls below the plus input voltage of the comparator 4.26, the output of the comparator 4.26 will switch to a logic 1 level which will enable the n-channel transistor 4.40 which will rapidly discharge the voltage on the minus input terminal of the comparator 4.26. This logic 1 level at the output of the comparator 4.26 will be inverted by the inverter 4.50 to place a logic 0 level on the lock output terminal 4.52.

However, when the fuse diode 4.38 has been blown or changed to a small resistance, then when the lock set voltage on node 4.44 switches to a logic 0 level, the RST* signal voltage that is coupled through the p-channel transistor 4.16 and the poly resistor 4.34 will be coupled through the fuse diode 4.38 onto the minus input of the comparator 4.26. In the preferred embodiment, the current through the n-channel transistor 4.22 multiplied by the resistance of the fuse diode 4.38 after it is blown is much less than the threshold voltage of the n-channel transistor 4.24, and the minus input voltage of the comparator 4.26 will be greater than the plus input voltage of the comparator 4.26. The output of the comparator 4.26 will therefore be a logic 0 level which will produce a logic 1 level on the lock output terminal 4.52.

The lock set signal on the lock set input terminal 4.44 in the preferred embodiment is brought high between each cycle of operation of the integrated circuit so that the protected data is relocked before each cycle. Therefore, if for some reason the lock signal on output terminal 4.52 should indicate a false unlock condition, the correct lock status will be restored prior to the next cycle. Thus, the lock set signal on node 4.44 is used to further assure that the lock signal on output terminal 4.52 will remain in a locked condition when the integrated circuit is being used by the end user. However, it will be appreciated that the lock set signal on node 4.44 does not have to be brought high between each cycle, but could be brought high at other times using signals inside the integrated circuit which are convenient for this relock function, or could be held low at all times if this added assurance is deemed unnecessary.

FIG. 4.3

Turning now to FIG. 4.2 and 4.3, the lock set signal on node 4.44 is at a logic 1 level any time any of the three inputs to the NAND gate 4.54 on the lines 4.57, 4.59, and 4.61 is at a logic 0 level. Thus, the lock set signal on node 4.44 will be a logic 1 level any time the output of the voltage level detector circuit 4.56 on line 4.57 is a logic 0 level, the output of the transient detection circuit 4.58 on line 4.59 is a logic 0 level, or the output of the comparator 4.60 on line 4.61 is at a logic 0 level. Each of these three circuits is responsive to the RST* signal at input terminal 4.12.

The level detection circuit 4.56 of FIG. 4.2 provides an undefined output when the RST* signal is less than the threshold voltage of the n-channel transistor 4.68, provides a logic 0 level to the input of the NAND gate 4.54 when the RST* signal voltage is between one threshold and two threshold voltages of the MOS transistors and provides a logic 1 level at its output when the RST* signal voltage is greater than two threshold voltages. More particularly, when the RST* signal voltage is less than one threshold voltage, the output at the common drain connection of the p-channel transistor 4.78 and the n-channel transistor 4.80 on the line 4.57 is undefined. When the RST* signal voltage goes above one threshold voltage but is less than two threshold voltages, than the drain of the n-channel transistor 4.68 will be at one threshold voltage. Advantageously, the p-channel transistor 4.70 and the n-channel transistor 4.72 have their channel dimensions ratioed such that the inverter circuit made by these two transistors triggers at one-half of the RST* signal voltage. Since under these conditions the drain voltage of the n-channel transistor 4.68 is greater than half of the RST* signal voltage, then the output of the first inverter stage consisting of the p-channel transistor 4.70 and the n-channel transistor 4.72 will be a logic 0 level and the output of the threshold detector circuit 4.56 will also be logic 0 level which will force the lock set signal to a logic 1 level. When the RST* signal voltage rises above two threshold voltages, then the drain voltage of the n-channel transistor 4.68 will remain at one threshold voltage but the output of the inverter circuit comprised of the p-channel transistor 4.70 and the n-channel transistor 4.72 will switch to a logic 1 level, and the threshold voltage detection circuit 4.56 will provide a logic 1 level on the line 4.57 to the NAND gate 4.54.

In normal operation the delay circuit 4.58 provides a logic 0 at its output for a predetermined time delay after the RST* pulse rises to a logic 1 level. The delay circuit 4.58 therefore operates as a one shot to provide a logic 0 output on the line 4.59 for a predetermined delay time after the rising edge of the RST* signal if the RST* signal rises faster than the RC time constant provided by the resistance of the channel of the p-channel transistor 4.82 and the capacitance of the capacitor 4.84. More particularly, when the RST* signal on the input terminal 4.12 rises, the capacitor 4.84 begins to charge through the p-channel transistor 4.82. When the voltage on the capacitor 4.84 is less than the trip voltage of the inverter consisting of the p-channel transistor 4.88 and the n-channel transistor 4.90, then the output of the delay circuit 4.58 will be a logic 0 level. When the voltage across the capacitor 4.84 exceeds the trip voltage of the first inverter circuit, then the output of the transient detection circuit 4.58 will be a logic 1 level. The diode 4.86 is used to quickly discharge the capacitor 4.84 when the RST* signal drops from a higher voltage to a lower voltage. Thus, in normal operation when the RST* signal on line 4.12 is brought high to initiate a cycle of operation of the integrated circuit, then the lock set signal is also brought to a logic 1 level for a time determined by the time constant of the p-channel transistor 4.82 and the capacitor 4.84 to relock the fuse and detection circuit 4.10. The time delay in the preferred embodiment is long enough to insure that the fusing and detection circuit 4.10 will be in a locked state. It will be appreciated that the delay circuit 4.58 will also provide a logic 0 level output on the line 4.59 if the RST* signal is pulled from a logic 1 level to some higher voltage, provided that the slope of the rising edge of the RST* signal is faster than the time constant of the p-channel transistor 4.82 and the capacitor 4.84.

The comparator 4.60 senses when the RST* signal voltage is less than or greater than the battery voltage at the VBAT input terminal 4.64. When the RST* signal voltage is less than the battery voltage, then the output of the comparator 4.60 on the line 4.61 will be a logic 0 level which will force the lock set signal to a logic 1 level. When the RST* signal voltage is greater than the battery voltage, then the output of the comparator 4.60 on the line 4.61 will be a logic 1 level.

Fusing Element

The fuse diode 4.38 in the preferred embodiment is an n+ diffusion formed in a p− well. The n+ diffusion is relatively shallow, on the order of 0.3 to 0.5 microns, and the fuse diode 4.38 is blown by reverse biasing the diode with 4.20 to 4.25 volts which places the diode in reverse breakdown condition with about 4.20 to 4.50 milliamps of current flowing through the diode. Under these conditions the aluminum metallization of the n+ contact alloys and spikes through the n+ diffusion into the p− well to form a low impedance resistive element.

In order for a voltage of this magnitude and a current this large to pass through the fuse diode 4.38, additional circuit elements are required to protect the integrated circuit from latch-up and to protect the stored data and calibration information from being changed by currents injected into the substrate. The poly resistors 4.34 and 4.42 are resistors formed in polysilicon and are provided to protect the substrate from large amounts of current injection during the fusing process. Since in the p-channel transistors 4.14 and 4.16 the p+ drain regions form a p-n juction with the n 31 substrate, the fuse voltage on the fuse input terminal 4.28 would be passed directly to the substrate if the poly resistors 4.30, 4.34, and 4.42 were not present to restrict the amount of current injected into the substrate. The poly resistor 4.42 is in place to protect the substrate after the fuse is blown. Also, the power supply providing the fuse voltage is current limited to approximately 4.50 milliamps or else the current through the fusing and detection circuit 4.10 would rise very high since the impedance of the fuse diode 4.38 drops dramatically when the aluminum spikes through the n+ region of the fuse diode 4.38. The n-channel transistor 4.40 has a large width-to-length ratio to carry the 4.50 milliamps of current used in the fusing operation. As stated above, the n-channel transistor 4.40 is enabled when the diode fuse 4.38 is not blown and the lock set node 4.44 is at a logic 0 level.

Because of the high voltage and the fact that some current is injected into the substrate during the programming operation, the fusing and detection circuit 4.10 is located in a separate region of the integrated circuit away from data stored in the integrated circuit, and is surrounded by appropriate guard rings to further lessen the effect of current injected into the substrate on the stored data in the other portions of the integrated circuit.

FIG. 4.4A

An alternative embodiment of the fusing element is shown in FIG. 4.4A in which the fuse diode 4.38 of FIG. 4.1 has been replaced by a fuse transistor 4.96. The drain of the fuse transistor 4.96 is connected to the common node of the n-channel transistor 4.32, the poly resistor 4.34 and the poly resistor 4.36. The source of the fuse transistor 4.96 is connected to its gate and also to its p− well and to the common connection of the drain of the n-channel transistor 4.22, the poly resistor 4.42, the drain of the n-channel transistor 4.40 and the negative input of the comparator 4.26.

The fuse transistor 4.96 operates in the same manner as the fuse diode 4.38. That is, the fuse transistor 4.96 operates as a reverse bias diode prior to being fused and has characteristics of a low impedance after the fuse transistor 4.96 has been blown.

FIG. 4.4B

FIG. 4.4B shows a sectional view of the fuse transistor 4.96 according to innovative teachings disclosed herein. The fuse transistor 4.96 is set in a p− well 4.100 and the gate 4.102 is connected to the source n+ region 4.104 and to a p+ contact 4.106 to the p− well. The p-n junction is formed between the p− well 4.100 and the drain n+ region 4.108. The n+ diffusion regions 4.104 and 4.108 are relatively shallow, on the order of 0.3 to 0.5 microns. The fuse transistor 4.96 is blown in the same manner as the fuse diode 4.38, i.e., by the application of 4.15 to 4.20 volts between the drain and source terminals of the fuse transistor 4.96. Advantageously, it has been found that the fuse transistor 4.96 is more easily blown (does not require as much current) and blows more consistently than the fuse diode 4.38. Thus, the fuse transistor 4.96 is used in the preferred embodiment.

How the fusing operation actually occurs in the fuse transistor 4.96 is not completely understood. The fusing action could be caused by the alloying and spiking through of the metalization over the drain n+ region in the p− well, but may also be caused by a short circuit formed from the drain n+ region 4.108 into the gate 4.102 or by some current path between the drain n+ region 4.108 and the source n+ region 4.104.

Protection Features

The fusing and detection circuit 4.10 of the present invention provides protection features to thwart several different methods of trying to unlock the circuit (by causing a logic 0 level at the lock output terminal 4.52 after the diode fuse 4.38 has been blown). One important protection feature used in the fusing and detection circuit 4.10 is that the polarity of the voltage used to blow the fuse diode 4.38 will not unlock the fusing and detection circuit 4.10 after the fuse diode 4.38 is blown, which was the problem with the example described in the second paragraph of this Description of the Preferred Embodiment section. Rather, instead of unlocking the fusing and detection circuit 4.10, the application of the voltage used to blow the fuse will cause a greater imbalance at the input of the comparator 4.26 and thereby lock up the fusing and detection circuit 4.10 "harder".

This feature can be understood by referring again to FIG. 4.1 and to the path of the voltage applied to the fuse input terminal 4.28. A positive voltage applied to the fuse input terminal 4.28 will cause the voltage at the cathode of the fuse diode 4.38 to rise which will also cause the gate voltage of the n-channel transistor 4.24 to rise and the voltage at the minus input terminal of the comparator 4.26 to rise. These two voltages will increase as the voltage at the cathode of the fuse diode 4.38 rises above the RST* signal voltage and will rise in equal amounts until the voltage at the cathode of the fuse diode 4.38 is greater than a threshold voltage above the RST* signal voltage. At this point the positive input of the comparator 4.26 will remain at the RST* signal voltage while the negative input of the comparator 4.26 will continue to rise with the voltage applied to the fuse input terminal 4.28. Since the lock output terminal 4.52 will indicate a lock condition when the minus input of the comparator 4.26 is greater than the positive input of the comparator 4.26, the higher voltage at the fuse input terminal 4.28 will thus cause a greater imbalance between the plus and minus inputs of the comparator 4.26.

As stated previously, attempts at unlocking the fusing and detection circuit 4.10 are encumbered by the required reset operation (pulling the RST* signal to a logic 0 level) between each cycle of the integrated circuit. Another protection measure is the n-channel transistor 4.32 which forms a diode in series with the fuse input terminal 4.28. Thus, it is not possible to pull the voltage at the cathode of the fuse diode 4.38 to a lower steady-state voltage by applying a low voltage at the fuse input terminal 4.28. Finally, the application of a higher voltage on the RST* input terminal 4.12 will not unlock the fusing and detection circuit 4.10 since the relative voltage differential between the plus and minus inputs of the comparator 4.26 will remain the same.

The fusing and detection circuit 4.10 also provides protection from transient voltages applied to the RST* input terminal 4.12 or the fuse input terminal 4.28. For example, if the RST* signal is brought high slowly in order to make ineffective the delay circuit 4.58, then the threshold detection circuit 4.56 will operate to lock the fusing and detection circuit 4.10 until the RST* signal is greater than two threshold voltages. The comparator 4.60 will also lock the fusing and detection circuit 4.10 until the RST* signal voltage is greater than the battery voltage. If an attempt is made to rapidly pull the RST* signal voltage from a logic 1 level to a greater voltage, then the delay circuit 4.58 will again provide a logic 0 output for a predetermined time period to thereby lock the fusing and detection circuit 4.10.

If an attempt is made to pull the fuse input terminal 4.28 to a minus voltage and to capacitively couple this negative pulse through the n-channel transistor 4.32, then the fusing and detection circuit 4.10 will retain the correct lock output since, in the preferred embodiment, the conductivity of the n-channel transistor 4.18 is slightly greater than the conductivity of the n-channel transistor 4.22 and thus the positive input of the comparator 4.26 will be pulled to a lower voltage faster than the minus input to the comparator 4.26.

It will be understood by those skilled in the art that the p-channel transistor 4.14 and the poly resistor 4.36 were added during the design process for reasons which later became obviated, but were left in the integrated circuit. While it is believed that the fusing and detection circuit 4.10 will operate properly without the p-channel transistor 4.14 and the poly resistor 4.36, the full effect of the removal of these devices is not known.

The fusing and detection circuit of the present invention is therefore able to provide circuitry for accommodating the voltages and currents required to blow the fuse diode 4.38 and for detecting the condition of the fuse diode 4.38, and for thwarting efforts to unlock the fusing and detection circuitry 4.10 by the application of steady state voltages and transient voltages to the external pins of the integrated circuit.

Although the invention has been described in part by making detailed reference to a specific embodiment, such detail is intended to be and will be understood to be instructional rather than restrictive. It will be appreciated by those skilled in the art that many variations may be made in the structure and mode of operation without departing from the spirit and scope of the invention, as disclosed in the teachings contained herein. For example, the fusing diode 4.38 could be replaced by a fusing element which is a low impedance prior to being blown and which becomes a high impedance after being blown. Under these conditions, the lock set circuitry including the n-channel transistor 4.48 and the inverter 4.46 would need to be suitably modified to force the proper lock status at the lock output terminal 4.52 since the polarity at the output of the comparator 4.26 would be a logic 1 level when the fusing element has been blown, which is opposite to the preferred embodiment described above. Also, the RST* signal voltage appearing at the RST input terminal 4.12 of FIG. 4.1 could be replaced by a constant supply voltage to provide power to the fusing and detection circuit of FIG. 4.1.

Immunity to Electrostatic Discharge (ESD)

Electrostatic discharge (ESD) onto a pin of an integrated circuit induces a large number of electrons or holes onto the integrated circuit chip in the vicinity of the pin. If the ESD is large enough, data stored in memory cells or in latches in the vicinity of the pin can be inverted by the ESD.

The present invention provides a latch which is highly resistant to ESD. In the preferred embodiment, an ESD resistant latch or R-S flip-flop is comprised of four cross-coupled NOR gate pairs are placed near the four corners of an integrated circuit chip and a fifth cross-coupled NOR gate pair placed generally in the center of the chip. The Q and Q* outputs from each of the five sets of cross-coupled NOR gate pairs are connected together as are the set and reset inputs to the five sets of cross-coupled NOR gate pairs. When an ESD is applied to one of the pins of the integrated circuit that is large enough to invert the status of a single cross-coupled NOR gate pair, the other four sets of cross-coupled NOR gate pairs will provide sufficient current sinking or sourcing to absorb the holes or electrons produced by the ESD and thus preserve the state stored in the five sets of cross-coupled NOR gate pairs.

FIG. 5.1

Turning now to the drawings, FIG. 5.1 is a layout diagram of an integrated circuit chip 5.10 which contains five sets of bistable multivibrators consisting of cross-coupled NOR gate pairs 5.12 in the preferred embodiment. As shown in FIG. 5.1, each of four of the cross-coupled NOR gate pairs 5.12 is located at each of the four corners of the integrated circuit chip 5.10, and the fifth cross-coupled NOR gate pair 5.12 is located inside a control logic block 5.16. A bus line 5.14 connects together the five sets of cross-coupled NOR gate pairs and is also connected to circuitry inside the control logic block 5.16 which is located approximately in the center of the integrated circuit chip 5.10. Located to the right of the control logic block 5.16 is a memory array 5.18. Located below the control logic block 5.16 is an oscillator and counter circuit 5.20 which contains storage registers holding the data bits which determine the length of the time-out counter and also contains storage registers holding calibration data for the time-out oscillator and counter. Thus each of the cross-coupled NOR gate pairs 5.12 are in a location remote from each of the other cross-coupled NOR gate pairs 5.12.

FIG. 5.2

Turning now to FIG. 5.2, the five sets of cross-coupled NOR gate pairs 5.12 are shown together with the four lines which make up the bus 5.14. As can be seen from FIG. 5.2 each of the cross-coupled NOR gate pairs 5.12 consists of an upper NOR gate 5.22 and a lower NOR gate 5.24, and each of the Q and Q* outputs of the five sets of cross-coupled NOR gate pairs 5.12 are connected together as is each of the R or reset inputs and each of the S or set inputs.

FIG. 5.3

Turning now to FIG. 5.3, one set of the cross-coupled NOR gate pairs 5.12 is shown in schematic detail. Each of the NOR gates 5.22 and 5.24 includes an upper p-channel transistor 5.26 in series with a second p-channel transistor 5.28, the drain of this p-channel transistor 5.28 performing the output terminal of the NOR gate. Coupled between the output terminal of the NOR gate and ground are two n-channel transistors connected in parallel. The first n-channel transistor 5.30 has its gate connected to the gate of the upper p-channel transistor 5.26 to form a first input terminal of the NOR gates 5.22 and 5.24, and the second n-channel transistor 5.32 has its gate connected to the gate of the lower p-channel transistor 5.28 to form a second input terminal of the NOR gates 5.22 and 5.24. In the upper NOR gate 5.22, this first input terminal is connected to the reset input of the bus line 5.14 and the second input is connected to the output of the NOR gate 5.24 which in turn is connected to the Q* line of the bus 5.14. In the lower NOR gate 5.24 the first input is connected to the output of the NOR gate 5.22 which in turn is connected to the Q line of the bus 5.14, and the second input is connected to the set input of the bus 5.14.

When used in the electronic key, the reset and set lines are both normally at a logic 0 level except when the R-S flip-flop circuit consisting of the five sets of NOR gate pairs 5.12 and the bus 5.14), is either being set or reset. If, for example, the R-S flip-flop circuit is in the set condition, then the Q line on the data bus 5.14 is at a logic 1 level. In this condition the upper p-channel transistors 5.26 and 5.28 of the NOR gate 5.22 will be conductive and n-channel transistors 5.30 and 5.32 will be nonconductive; while the upper p-channel transistor 5.26 of the NOR gate 5.24 will be nonconductive and the n-channel transistor 5.30 will be conductive, thus providing a logic 0 level on the Q* line.

If one of the five sets of cross-coupled NOR gate pairs 5.12 were to receive an electrostatic discharge of electrons, then the output terminal of the upper NOR gate 5.22, which is at a logic 1 voltage, would attract a large number of electrons which would tend to decrease the voltage at the output terminal of the logic gate 5.22. If the cross-coupled NOR gate 5.12 receiving the ESD was not connected to the other four cross-coupled NOR gates 5.12, and if enough electrons are injected into the output terminal of the NOR gate 5.22, the output of the NOR gate 5.22 would switch to a logic 0 level which in turn would switch the output of the NOR gate 5.24 to a logic 1 level. However, as the voltage at the output of the NOR gate 5.22 on the Q line of the data bus 5.14 begins to be pulled down by the electrons from the electrostatic discharge, the other four sets of cross-coupled NOR gate pairs 5.12, which are remote from the cross-coupled NOR gate 5.12 directly affected by the ESD, will supply the current necessary to compensate for these extra electrons.

The above-described invention provides an increased margin of resistance to electrostatic discharge compared to a single latch circuit which has large transistor geometries since a large transistor also tends to attract more electrons or holes than a smaller transistor device. The present invention avoids this problem by locating the individual sets of cross-coupled NOR gate pairs 5.12 at locations remote from each other so that a single electrostatic discharge affects only one of the five sets of the cross-coupled NOR gate pairs 5.12.

As shown in FIG. 5.1, one of the cross-coupled NOR gate pairs 5.12 is located in the central portion of the integrated circuit chip 5.10. Thus, a person trying to invert the status of the five sets of cross-coupled NOR gate pairs 5.12 would have to provide sufficient electrostatic discharge energy to not only invert the cross-coupled NOR gate pairs 5.12, but also to invert at least some of the data stored in the memory array 5.18 or in the calibration circuitry in the oscillator and counter circuit 5.20.

The above-described invention, therefore, provides a data latch which is highly resistant to electrostatic discharge and further thwarts efforts by a person attempting to invert the status of the cross-coupled NOR gate pairs 5.12 by locating at least one of the cross-coupled NOR gate pairs 5.12 near data stored on the integrated circuit chip.

Although the invention has been described in part by making detailed reference to a certain specific embodiment, such detail is intended to be and will be understood to be instructional rather than restrictive. It will be appreciated by those skilled in the art that many variations may be made in the structure and mode of operation without departing from the scope and spirit of the invention, as disclosed in the teachings contained herein. For example an ESD resistant latch according to innovative teachings disclosed herein may be used with virtually any type of bistable multivibrator circuit such as cross-coupled NAND gates, D latches, and other circuits such as a pair of inverter circuits placed in series. In this circuit the output of the last inverter is coupled through a transmission gate to the input of the first inverter with a second transmission gate coupling an input signal to the input of the first inverter, the two transmission gates operating in a complementary manner such that only one transmission gate is conductive at any one time.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly their scope is not limited except by the allowed claims.

What is claimed is:

1. An electronic key, comprising:
  a timing circuit which can be calibrated;
  a fusing and detection circuit, comprising:
    a fuse element;
    a fuse input terminal, connected so that said fuse element can be blown by applying a large abnormal voltage to said fuse input terminal;
    a comparator,
    having first and second inputs operatively connected to said fuse element in such relation that
    said first input of said comparator receives a voltage which is dependent on the state of said fuse element
    and said second input of said comparator receives a voltage which is not substantially dependent on the state of said fuse element,
    wherein said comparator compares said first and second inputs and provides a logic output which, in a first state, indicates that said fuse element has not been blown, and, in a second state, indicates that said fuse element has been blown;
    wherein said fuse input terminal is operatively connected to said inputs of said comparator in such relation that any large abnormal voltage which is applied to said fuse input terminal will tend to drive the output of said comparator into said second state;
    wherein said output of said comparator is connected to said timing circuit so that said second output state of said comparator prevents calibration of said timing circuit;
  a counter, connected to count accesses to said electronic key;
  control logic including a latch which can be set by receipt of a predetermined external command, said control logic being configured so that
    at least some commands are accepted before said fuse element has been blown but are not accepted after said fuse element is blown;
    at least some other commands are accepted after said fuse element has been blown and before said latch has been set, but are not accepted after said latch has been set; and
    at least some other commands are accepted after said latch has been set and before said counter counts off a predetermined number of accesses, but are not accepted after said counter has counted said predetermined number of accesses; wherein said latch cannot be reset after said fuse element has been blown; and wherein said control logic and said counter are configured so that, if power is restored after said fuse element has already been blown, said counter will immediately provide an output indicating that said predetermined number of accesses has already occurred.

* * * * *